(12) United States Patent
Huang

(10) Patent No.: US 11,798,826 B2
(45) Date of Patent: Oct. 24, 2023

(54) WAFER-MEASURING APPARATUS AND WAFER-TRANSFERRING METHOD THEREOF

(71) Applicant: NANYA TECHNOLOGY CORPORATION, New Taipei (TW)

(72) Inventor: Jih-Cheng Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 511 days.

(21) Appl. No.: 17/025,868

(22) Filed: Sep. 18, 2020

(65) Prior Publication Data
US 2022/0093433 A1 Mar. 24, 2022

(51) Int. Cl.
*H01L 21/67* (2006.01)
*H01L 21/677* (2006.01)

(52) U.S. Cl.
CPC .... *H01L 21/67271* (2013.01); *H01L 21/6773* (2013.01); *H01L 21/67742* (2013.01)

(58) Field of Classification Search
CPC .......... H01L 21/67271; H01L 21/6773; H01L 21/67742; H01L 21/67184; H01L 21/67766; H01L 21/67778
See application file for complete search history.

(56) References Cited

U.S. PATENT DOCUMENTS

| | | | | |
|---|---|---|---|---|
| 5,382,127 A | * | 1/1995 | Garric | G03F 7/70808 |
| | | | | 414/940 |
| 10,283,393 B1 | * | 5/2019 | Liu | H01L 21/67778 |
| 2007/0269267 A1 | * | 11/2007 | Roberts | B66F 19/005 |
| | | | | 404/73 |
| 2011/0076117 A1 | * | 3/2011 | Iizuka | H01L 21/67748 |
| | | | | 414/217 |
| 2019/0019719 A1 | * | 1/2019 | Atwood | H01L 21/68707 |
| 2019/0378735 A1 | * | 12/2019 | Kim | H01L 21/68707 |

FOREIGN PATENT DOCUMENTS

| | | |
|---|---|---|
| TW | 201130074 A1 | 9/2011 |
| TW | 201919145 A | 5/2019 |

* cited by examiner

*Primary Examiner* — Gene O Crawford
*Assistant Examiner* — Abby A Jorgensen
(74) *Attorney, Agent, or Firm* — Muncy, Geissler, Olds & Lowe

(57) ABSTRACT

A wafer-measuring apparatus and a wafer-transferring method of the wafer-measuring apparatus. The wafer-measuring apparatus includes a body, a wafer-measuring unit, a wafer storage, and a robot. The robot is disposed on the body and configured to move a wafer from a first wafer container to the wafer-measuring unit. The first wafer container is disposed on a load port area. The robot moves the wafer from the wafer-measuring unit to the wafer storage after the wafer-measuring unit measures the wafer.

10 Claims, 27 Drawing Sheets

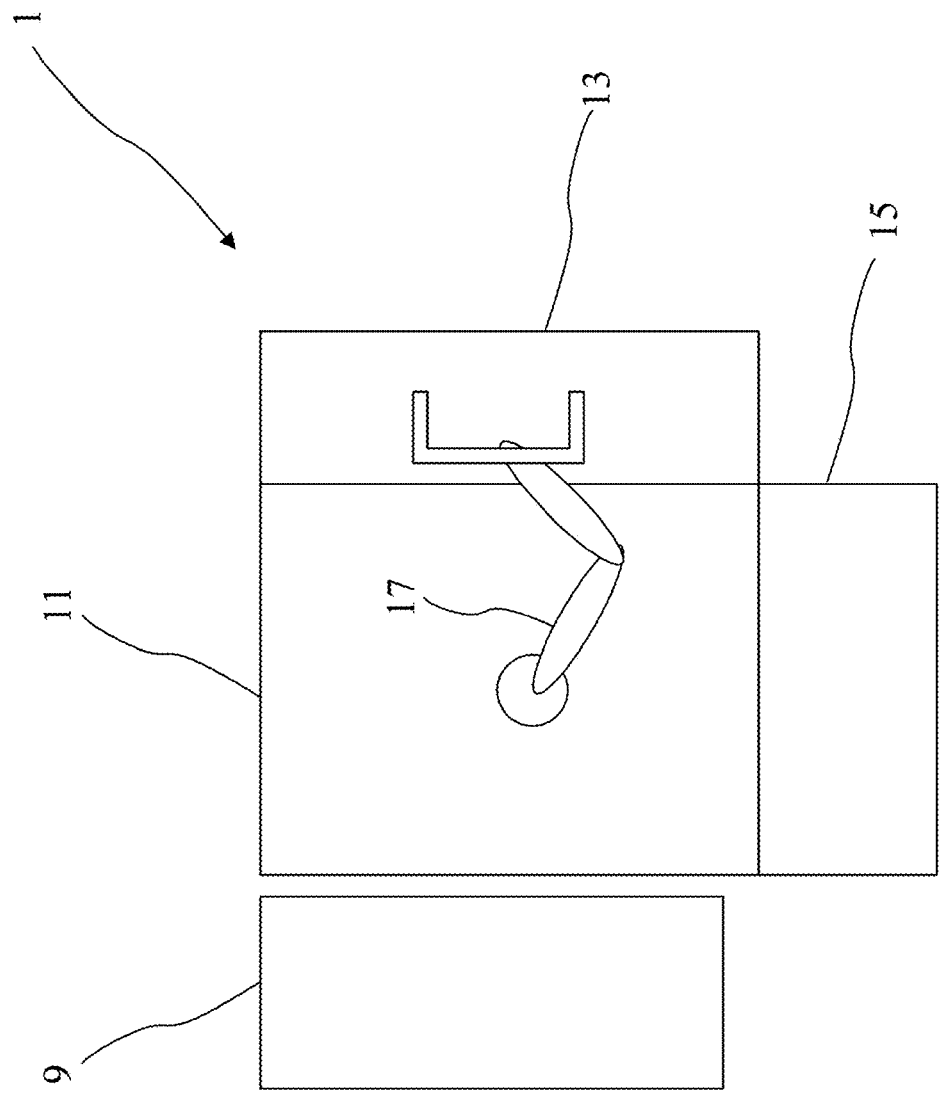

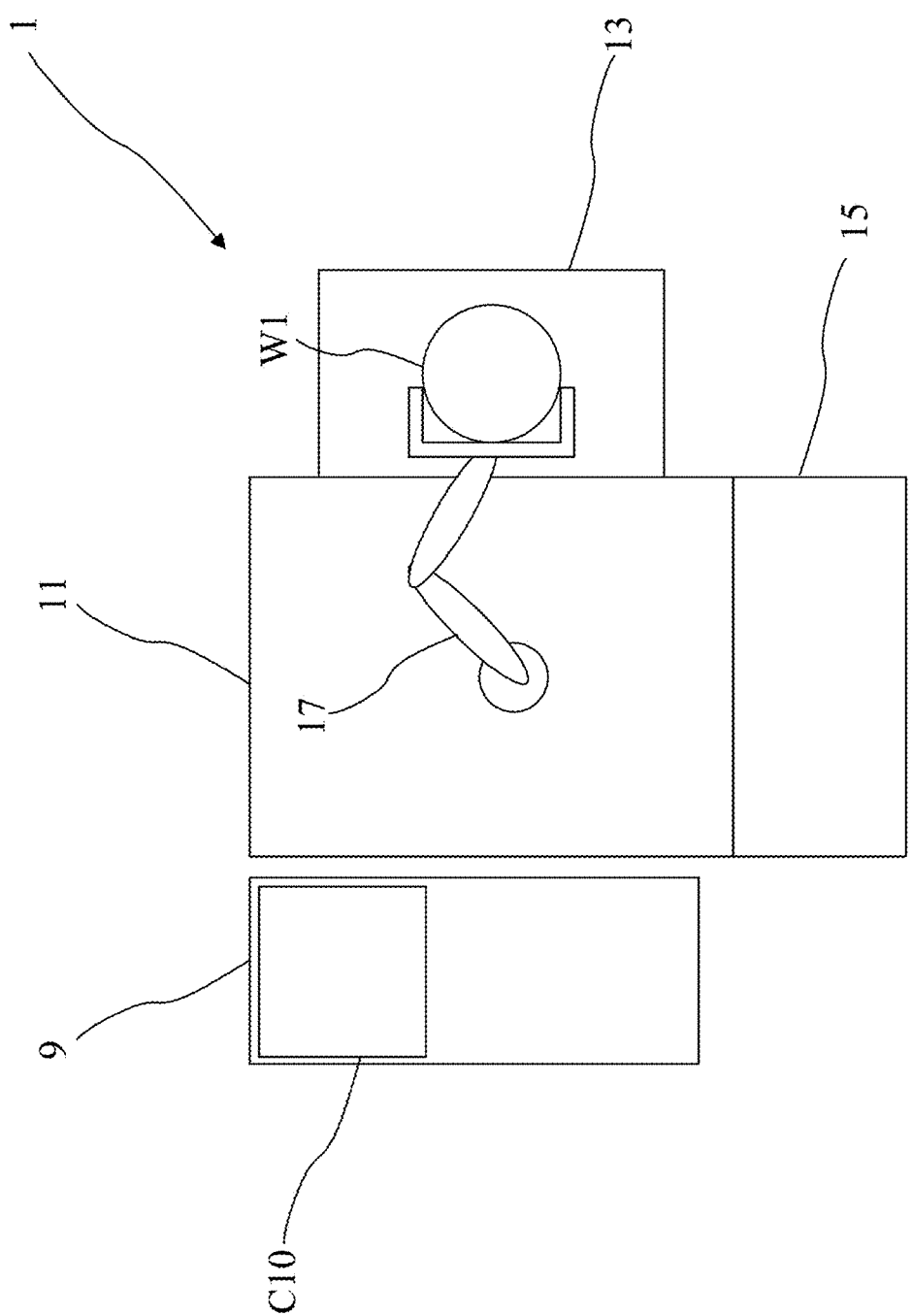

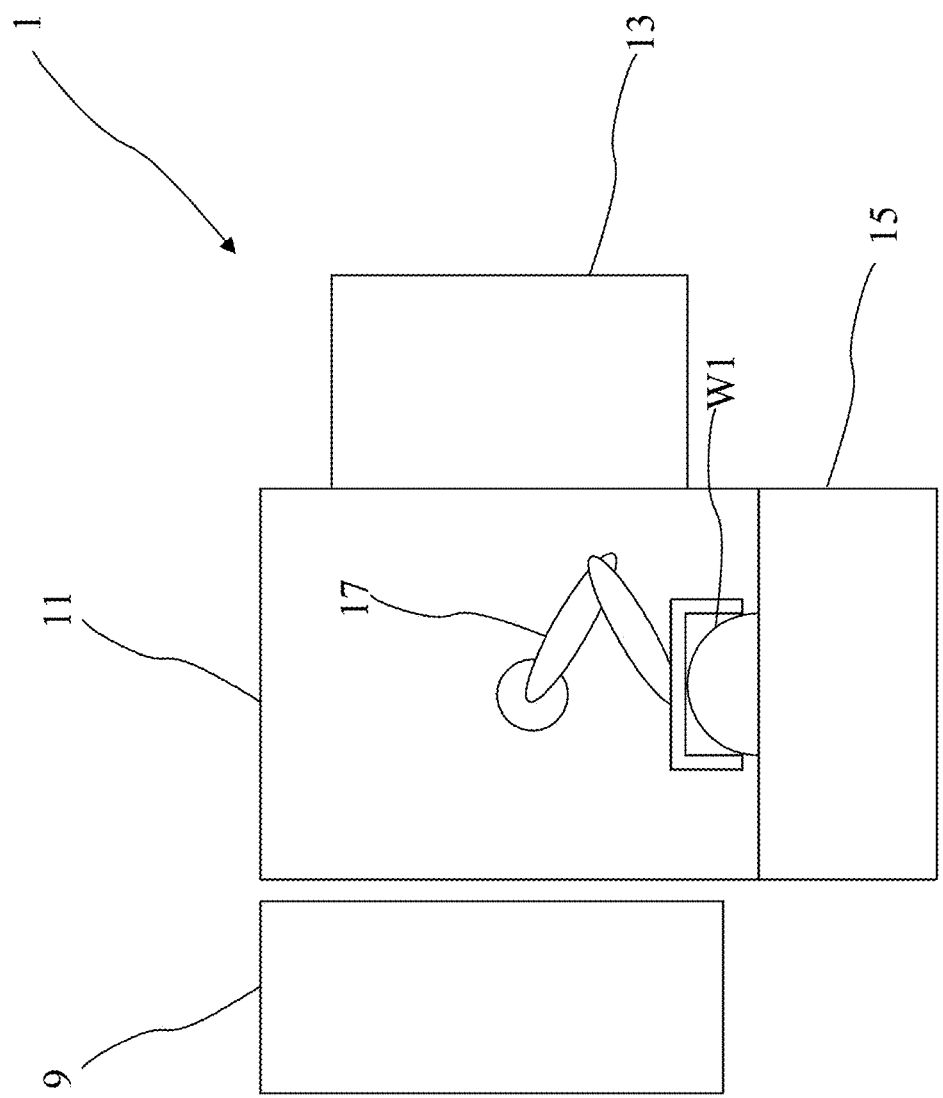

WAFER-MEASURING APPARATUS AND WAFER-TRANSFERRING METHOD THEREOF

TECHNICAL FIELD

The present disclosure relates to a wafer-measuring apparatus and a wafer-transferring method thereof, and more particularly, to a wafer-measuring apparatus and a wafer-transferring method capable of buffering transfer of wafers after wafer measurement.

DISCUSSION OF THE BACKGROUND

In the semiconductor industry, a wafer-measuring apparatus is used for measuring a state of a wafer. In detail, first, a wafer container loaded with wafers is moved to the wafer-measuring apparatus, and then each of the wafers is moved to a measuring unit for being measured. After measurement, the measured wafer is moved back to the wafer container used for loading the wafer. However, when the wafer container is loaded with a small number of wafers, the throughput of the wafer-measuring apparatus is limited because the time required to measure each wafer is much less than the time required to move the wafer container to or away from the wafer-measuring apparatus.

In addition, because the measured wafer should be returned to the wafer container from which it was removed, the wafer container may need to be moved to a sorter for sorting the measured wafers into different wafer containers, which may cause extra transportation of the wafer containers and consume cycle time.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a wafer-measuring apparatus, including a body, a wafer-measuring unit, a wafer storage and a robot. The robot is disposed on the body and configured to: move a wafer from a first wafer container to the wafer-measuring unit, wherein the first wafer container is disposed on a load port area; and move the wafer from the wafer-measuring unit to the wafer storage after the wafer-measuring unit measures the wafer.

In some embodiments, the robot is further configured to: move the wafer from the wafer storage to a second wafer container. The second wafer container is disposed on the load port area.

In some embodiments, the wafer storage further includes a plurality of storage areas. In some embodiments, the step of moving the wafer from the wafer-measuring unit to the wafer storage further includes moving the wafer from the wafer-measuring unit to one storage area of the wafer storage after the wafer-measuring unit measures and classifies the wafer.

In some embodiments, each storage area corresponds to one wafer state.

In some embodiments, the wafer-measuring apparatus further includes a rail. The rail is disposed on the body. The robot moves along the rail.

In some embodiments, the wafer storage is attached to the body independent of the load port area.

In some embodiments, the wafer storage further includes an inlet port for connecting to a gas source.

Another aspect of the present disclosure provides a wafer-measuring apparatus, including a body, a wafer-measuring unit, a wafer storage, a first robot and a second robot. The body includes a first area, a second area and a buffer area. The first robot is disposed on the first area of the body and configured to: move a wafer from a first wafer container to the wafer-measuring unit, wherein the first wafer container is disposed on a first load port area; and move the wafer from the wafer-measuring unit to the buffer area of the body after the wafer-measuring unit measures the wafer. The second robot is disposed on the second area of the body and configured to: move the wafer from the buffer area of the body to the wafer storage.

In some embodiments, the second robot is further configured to: move the wafer from the wafer storage to a second wafer container. The second wafer container is disposed on a second load port area.

In some embodiments, the wafer storage is attached to the body independent of the first load port area and the second load port area.

In some embodiments, the wafer storage further includes a plurality of storage areas. In some embodiments, the step of moving the wafer from the wafer-measuring unit to the buffer area of the body further includes: moving the wafer from the wafer-measuring unit to the buffer area of the body after the wafer-measuring unit measures and classifies the wafer. In some embodiments, the step of moving the wafer from the buffer area of the body to the wafer storage further includes: moving the wafer from the buffer area of the body to one storage area of the wafer storage.

In some embodiments, each storage area corresponds to one wafer state.

In some embodiments, the wafer-measuring apparatus further includes a first rail. The first rail is formed on the first area of the body.

The first robot moves along the first rail.

In some embodiments, the wafer-measuring apparatus further includes a second rail. The second rail is formed on the second area of the body. The second robot moves along the second rail.

In some embodiments, the wafer storage further comprises an inlet port for connecting to a gas source.

In some embodiments, the buffer area is located between the first area and the second area.

Another aspect of the present disclosure provides a wafer-transferring method of a wafer-measuring apparatus. The wafer-transferring method includes: moving, by a robot set of the wafer-measuring apparatus, a wafer from a first wafer container to a wafer-measuring unit of the wafer-measuring apparatus, wherein the first wafer container is disposed on a first load port area; measuring, by the wafer-measuring unit, the wafer; and moving, by the robot set, the wafer from the wafer-measuring unit to a wafer storage of the wafer-measuring apparatus after the wafer is measured.

In some embodiments, the wafer storage of the wafer-measuring apparatus is independent of the first load port area.

In some embodiments, the robot set further includes a first robot and a second robot. In some embodiments, the step of moving the wafer from the first wafer container to the wafer-measuring unit further includes: moving, by the first robot, the wafer from the first wafer container to the wafer-measuring unit of the wafer-measuring apparatus. In some embodiments, the step of moving the wafer from the wafer-measuring unit to the wafer storage further includes: moving, by the first robot, the wafer from the wafer-measuring unit to a buffer area of the wafer-measuring apparatus after the wafer-measuring unit measures the wafer; and moving, by the second robot, the wafer from the buffer area of the wafer-measuring apparatus to the wafer storage of the wafer-measuring apparatus.

In some embodiments, the wafer-transferring method further includes: moving, by the second robot, the wafer from the wafer storage to a second wafer container. The second wafer container is disposed on a second load port area.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope or the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 1A is a schematic view of a wafer-measuring apparatus according to some embodiments of the present disclosure.

FIG. 1C is a schematic view of a wafer-measuring apparatus transferring a wafer according to some embodiments of the present disclosure.

FIG. 1D is a schematic view of a wafer-measuring apparatus transferring a wafer according to some embodiments of the present disclosure.

DETAILED DESCRIPTION

Figure 1B:
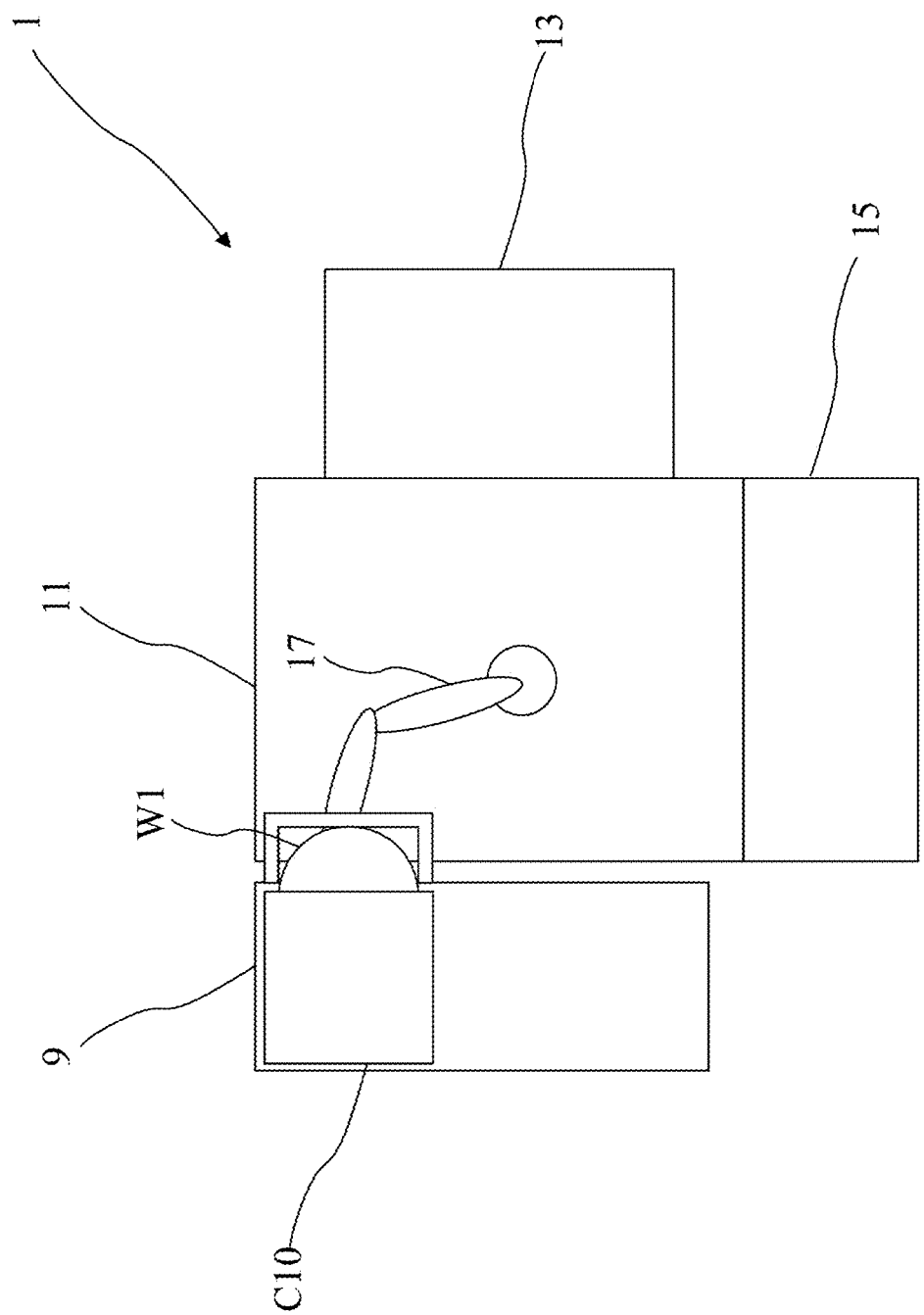
FIG. 1B is a schematic view of a wafer-measuring apparatus transferring a wafer according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be tem timed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic view of a wafer-measuring apparatus 1 according to some embodiments of the present disclosure. The wafer-measuring apparatus 1 may be used for measuring wafers stored in a wafer container (e.g., a front-opening unified pod, FOUP). The wafer-measuring apparatus 1 may include a body 11, a wafer-measuring unit 13, a wafer storage 15 and a robot 17. The robot 17 may be disposed on the body 11. The wafer container may be disposed on a load port area 9.

Please refer to FIGS. 1B to 1D, which are schematic views of the wafer-measuring apparatus 1 transferring a wafer according to some embodiments of the present disclosure. In detail, when a wafer container C10 loaded with wafers is disposed on the load port area 9, the robot 17 of the wafer-measuring apparatus 1 may fetch a wafer W1 stored in the wafer container C10, and move the wafer W1 from the wafer container. C10 to the wafer-measuring unit 13. After the robot 17 places the wafer W1 on the wafer-measuring unit 13, the wafer-measuring unit 13 may measure the wafer W1 for determining a state of the wafer W1.

In some embodiments, when the wafer W1 needs to be placed back in the wafer container C10 after the measurement, the robot 17 may move the wafer W1 from the wafer-measuring unit 13 back to the wafer container C10.

In some embodiments, when the wafer W1 needs to be placed in another wafer container after the measurement, the robot 17 may first move the wafer W1 from the wafer-measuring unit 13 to the wafer storage 15. Accordingly, the wafer container C10 may be moved away from the wafer-measuring apparatus 1 without returning the wafer W1 back to the wafer container C10.

In addition, because the wafer W1 may be stored in the wafer storage 15 until a target wafer container for storing the wafer W1 is disposed on the load port area 9, the wafer W1 may not need to be further sorted by an additional sorter.

Figure 2A:
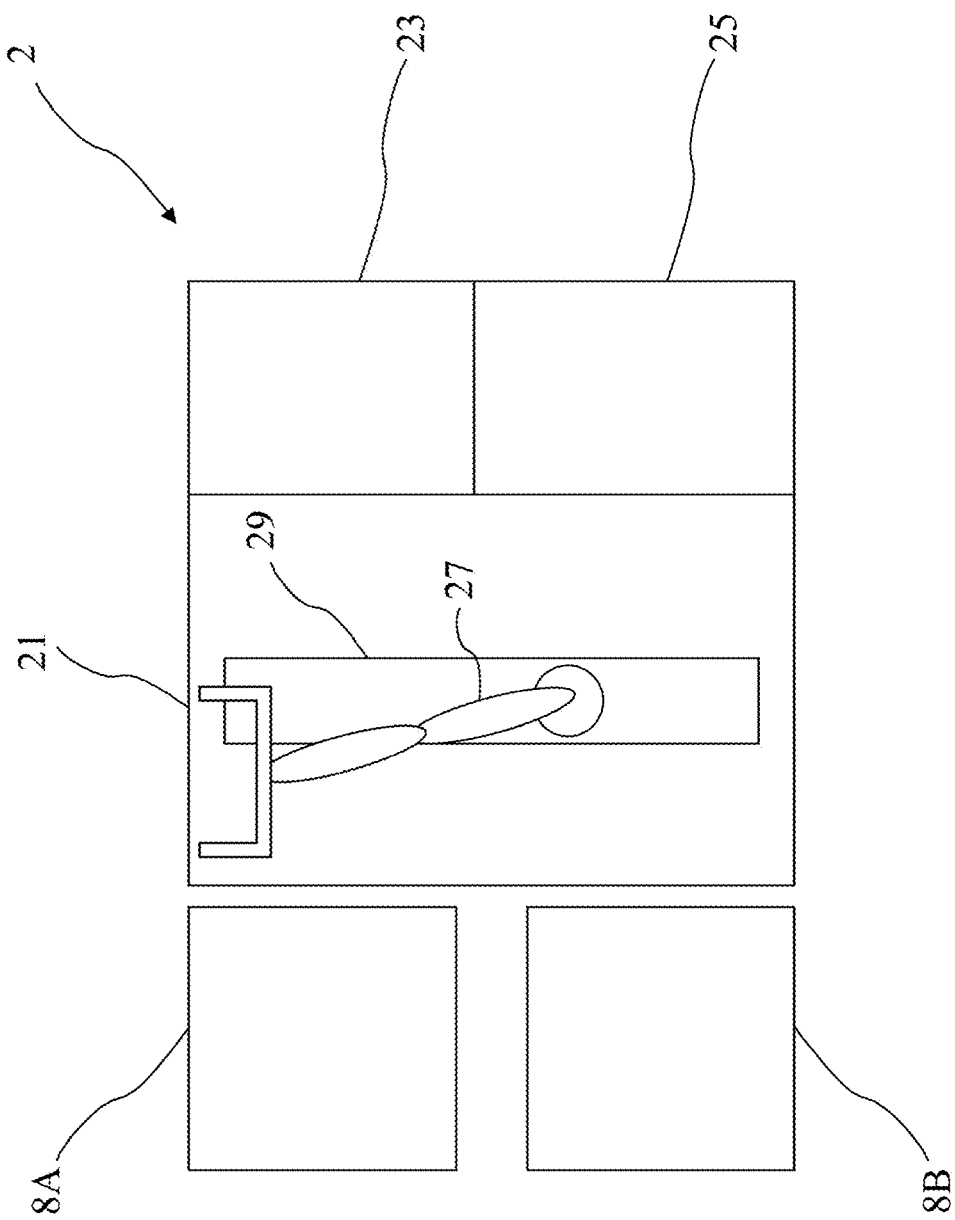
FIG. 2A is a schematic view of a wafer-measuring apparatus according to some embodiments of the present disclosure.
Figure 2B:
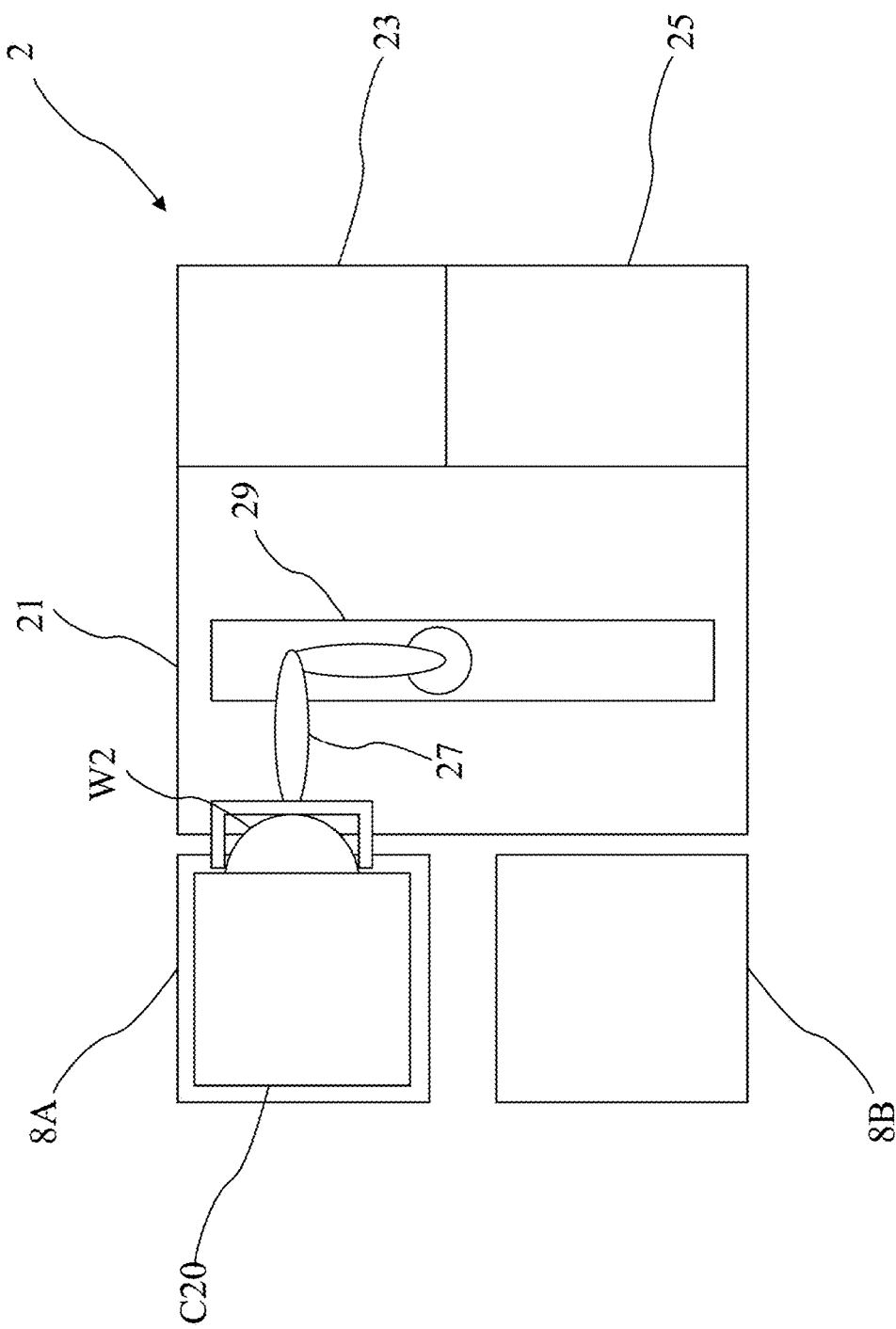
FIG. 2B is a schematic view of a wafer-measuring apparatus transferring a wafer according to some embodiments of the present disclosure.
Figure 2C:
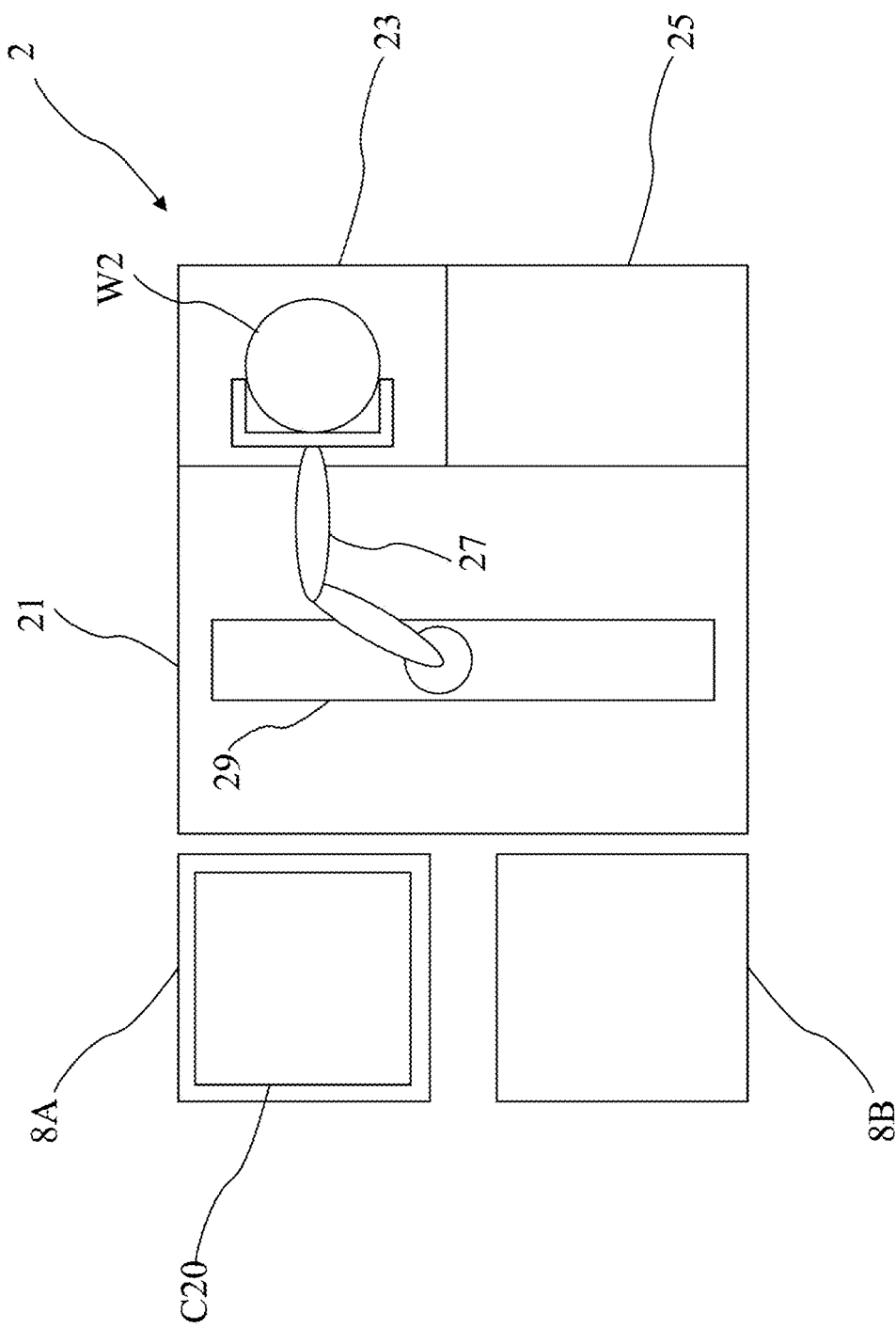
FIG. 2C is a schematic view of a wafer-measuring apparatus transferring a wafer according to some embodiments of the present disclosure.
Figure 2D:
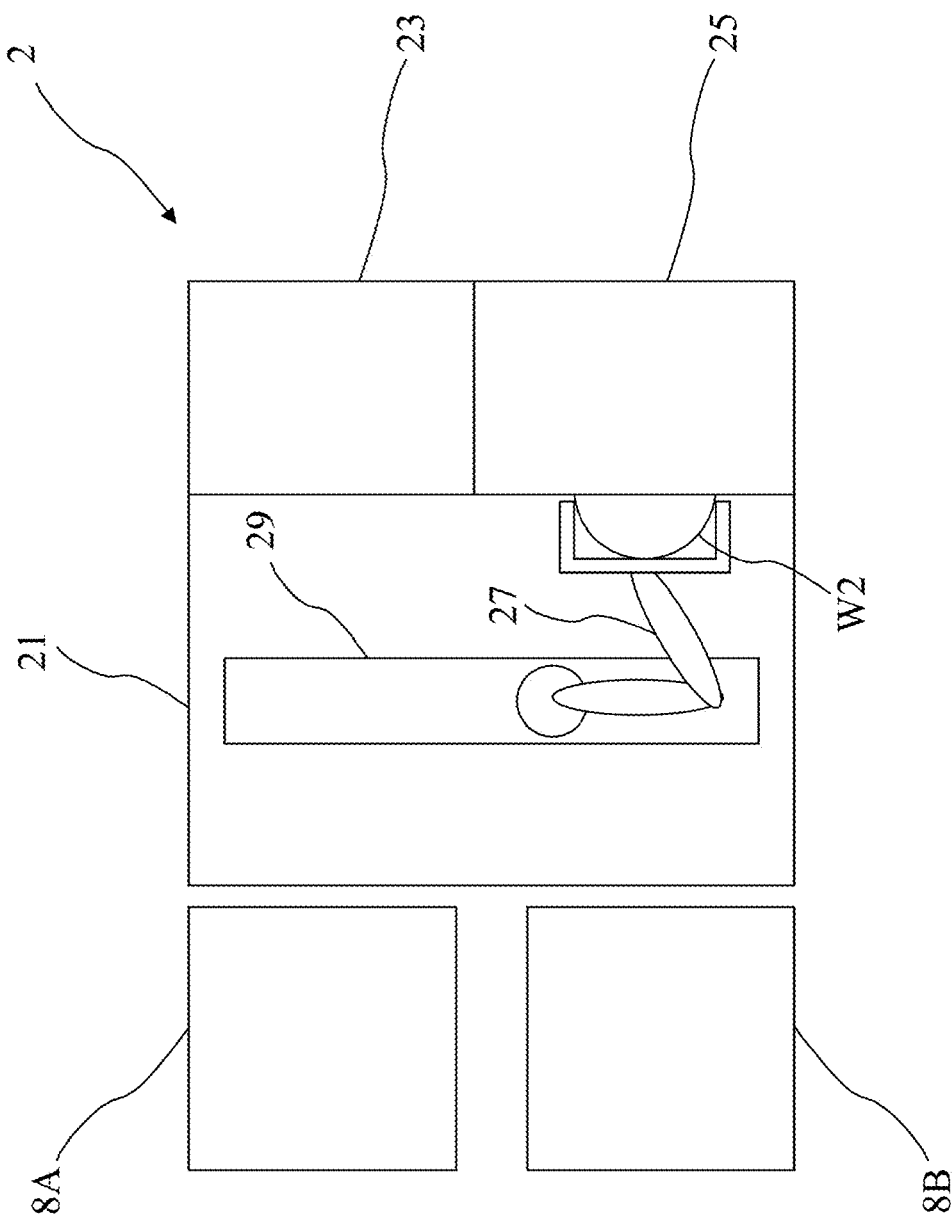
FIG. 2D is a schematic view of a wafer-measuring apparatus transferring a wafer according to some embodiments of the present disclosure.
Figure 2E:
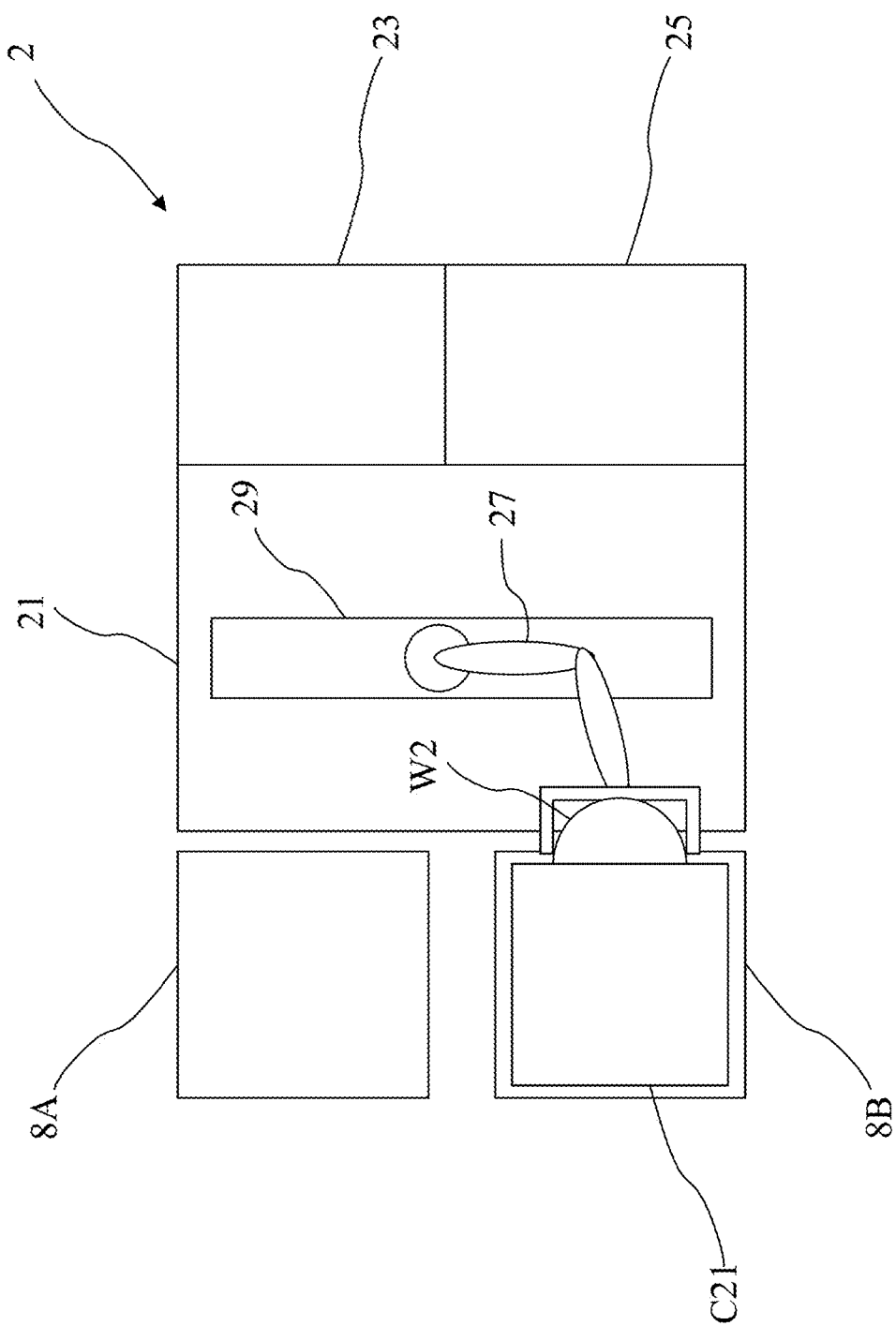
FIG. 2E is a schematic view of a wafer-measuring apparatus transferring a wafer according to some embodiments of the present disclosure.

FIG. 2A is a schematic view of a wafer-measuring apparatus 2 according to some embodiments of the present disclosure. The wafer-measuring apparatus 2 may be used for measuring wafers stored in a wafer container (e.g., a FOUP). The wafer-measuring apparatus 2 may include a body 21, a wafer-measuring unit 23, a wafer storage 25, a robot 27 and a rail 29.

The rail 29 may be formed on the body 21. The robot 27 may be disposed on the body 21 and move along the rail 29. The wafer container may be disposed on load port areas 8A and 8B. In some embodiments, the load port areas 8A and 8B may include load port devices respectively.

Please refer to FIGS. 2B to 2E, which are schematic views of the wafer-measuring apparatus 2 transferring a wafer according to some embodiments of the present disclosure. In detail, when a wafer container. C20 loaded with wafers is disposed on the load port area 8A, the robot 27 of the wafer-measuring apparatus 2 may fetch a wafer W2 stored in the wafer container C20, and move the wafer W2 from the wafer container C20 to the wafer-measuring unit 23. After the robot 27 places the wafer W2 on the wafer-measuring unit 23, the wafer-measuring unit 23 may measure the wafer W2 for determining a state of the wafer W2.

In some embodiments, when the wafer W2 needs to be placed back in the wafer container C20 after the measurement, the robot 27 may move the wafer W2 from the wafer-measuring unit 23 back to the wafer container C20.

In some embodiments, when the wafer W2 needs to be placed in another wafer container after the measurement, the robot 27 may first move the wafer W2 from the wafer-measuring unit 23 to the wafer storage 25. Accordingly, the wafer container C20 may be moved away from the wafer-measuring apparatus 2 without returning the wafer W2 back to the wafer container C20.

In addition, because the wafer W2 may be stored in the wafer storage 25 until a target wafer container C21 for storing the wafer W2 is disposed on the load port area 8A or 8B, the wafer W2 may not need to be further sorted by an additional sorter.

More particularly, in some embodiments, during the operations of the wafer-measuring apparatus 2, the wafer container C21 for storing the wafer W2 may be disposed on the load port area 8B. Accordingly, when the wafer container C21 is ready, the robot 27 may move the wafer W2 from the wafer storage 25 to the wafer container C21.

In some embodiments, the wafer storage 25 may be attached to the body 21 independent of the load port areas 8A and 8B. Particularly, the wafer storage 25 may be an independent wafer storage unit attached to the body 21. In other words, the wafer storage 25 may be used as a buffer storage of the wafer-measuring apparatus 2 for storing measured wafers.

Figure 2F:
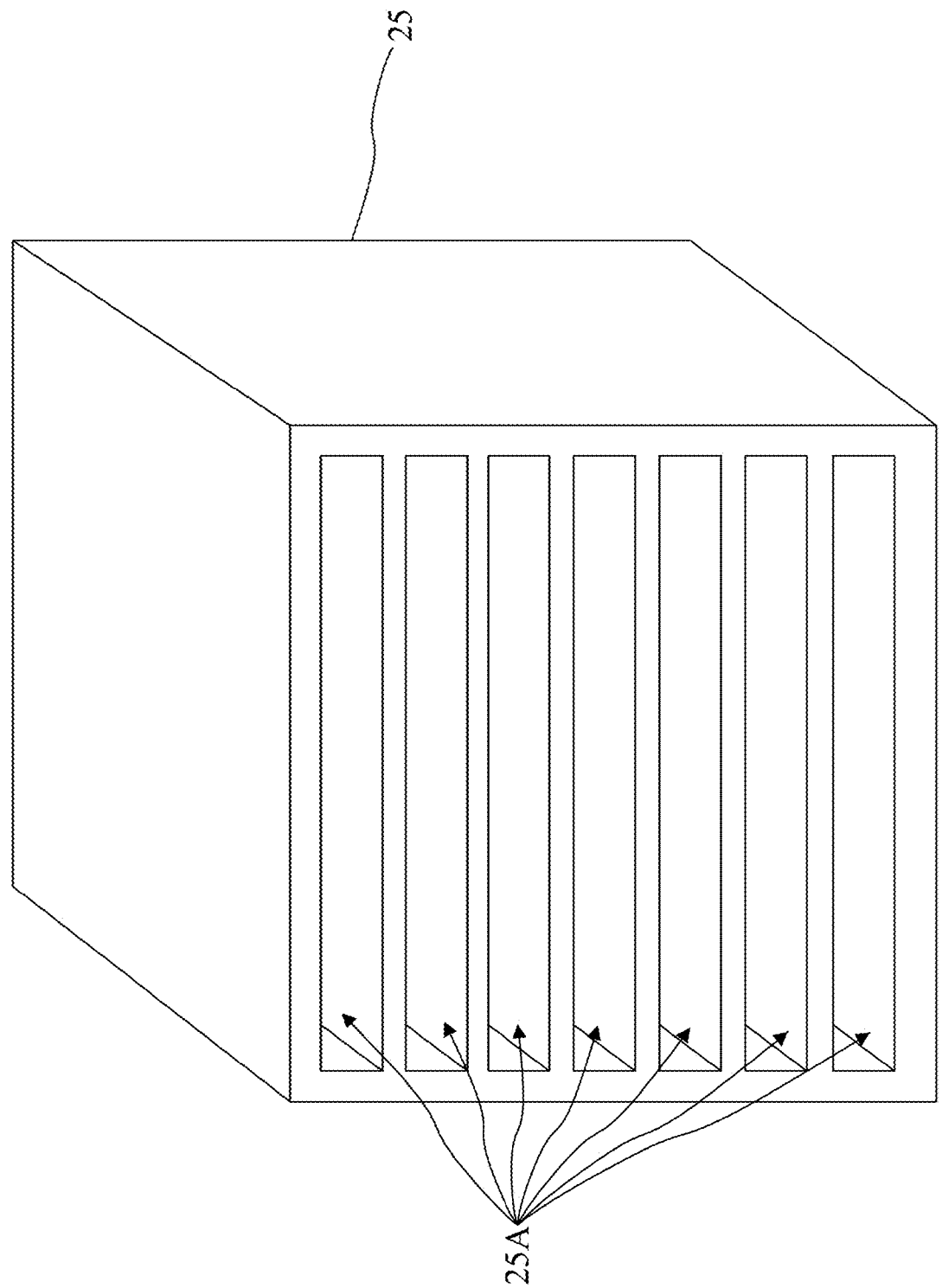
FIG. 2F is a schematic view of a wafer storage according to some embodiments of the present disclosure.

In some embodiments, the wafer storage 25 may be used for storing wafers with different states. Please refer to FIG. 2F, which is a schematic view of the wafer storage 25 according to some embodiments of the present disclosure. In detail, the wafer storage 25 may include a plurality of storage areas 25A. Each storage area 25. A may correspond to one wafer state. More specifically, the storage area 25A corresponding to a specific wafer state may be used for storing the wafer measured as the specific wafer state.

For example, when a wafer is measured and classified as a state "X" by the wafer-measuring unit 23, the robot 27 moves the wafer from the wafer-measuring unit 23 to one storage areas 25A, which is used for storing wafers with state "X," of the wafer storage 25. Further, when a specific wafer container used for storing wafers with state "X" is disposed on the load port area 8A or 8B, the robot 27 moves the wafer from the storage areas 25A for storing wafers with state "X" to the specific wafer container.

Similarly, when a wafer is measured and classified as state "Y" by the wafer-measuring unit 23, the robot 27 moves the wafer from the wafer-measuring unit 23 to one storage area 25A, which is used for storing wafers with state "Y," of the wafer storage 25. Further, when a specific wafer container used for storing wafer with state "Y" is disposed on the load port area 8A or 8B, the robot 27 moves the wafer from the storage areas 25A for storing wafer with state "Y" to the specific wafer container.

In some embodiments, the wafer storage 25 may include an inlet port (not shown) for connecting to a gas source (not shown). Therefore, airborne molecular contamination (AMC) in the wafer storage 25 may be purged out by gases provided from the gas source.

Figure 3A:
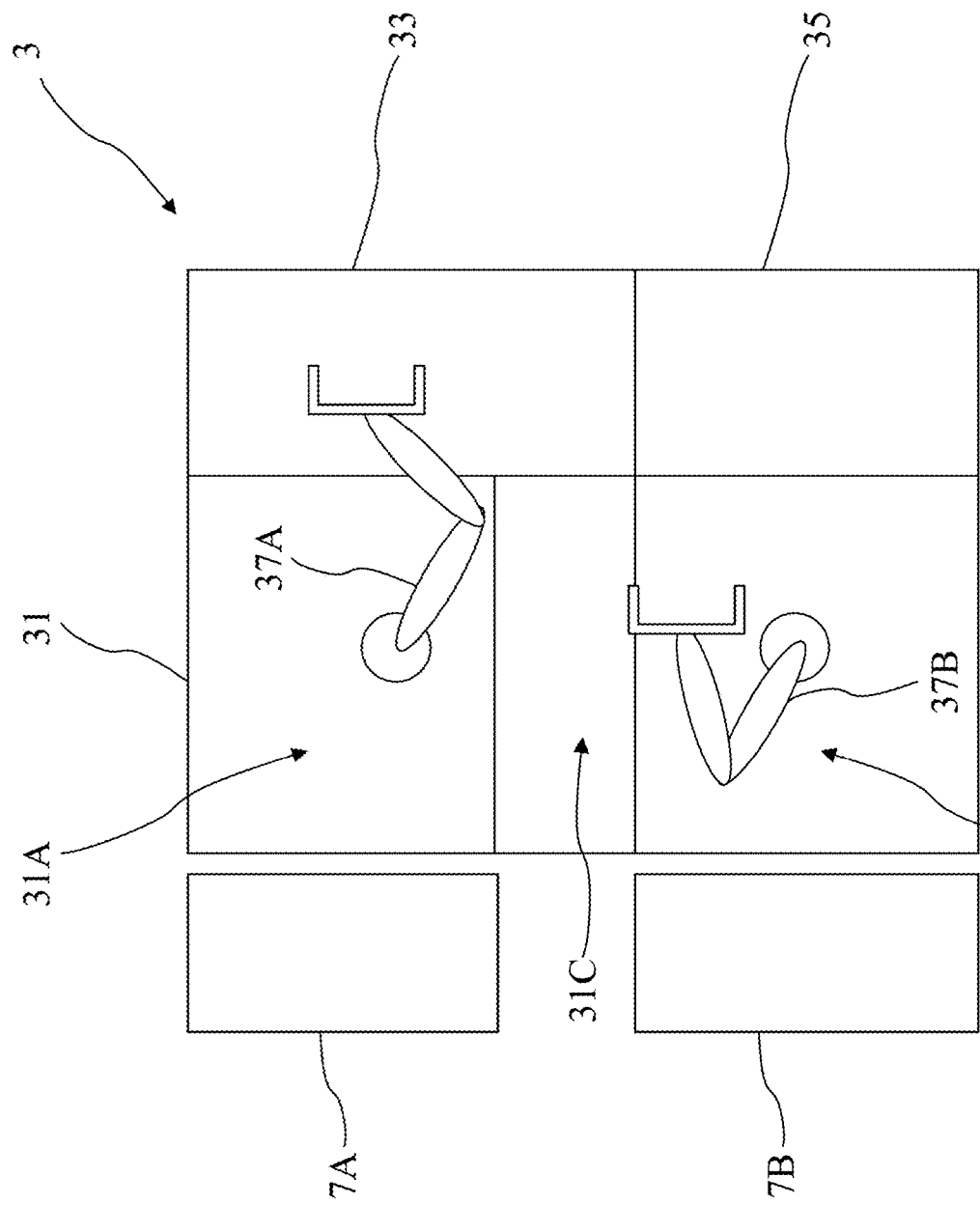
FIG. 3A is a schematic view of a wafer-measuring apparatus according to some embodiments of the present disclosure.
Figure 3B:
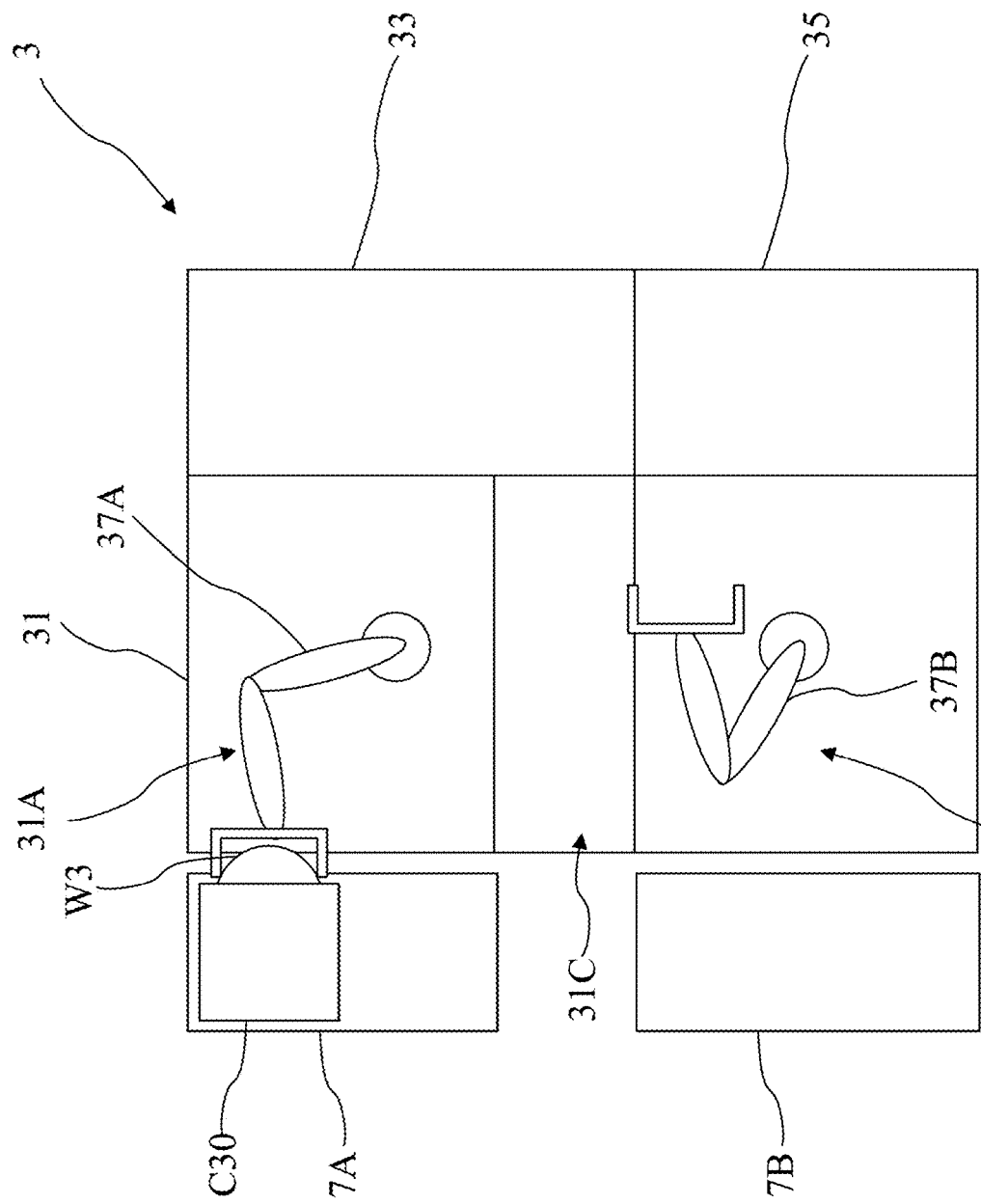
FIG. 3B is a schematic view of a wafer-measuring apparatus transferring a wafer according to some embodiments of the present disclosure.
Figure 3C:
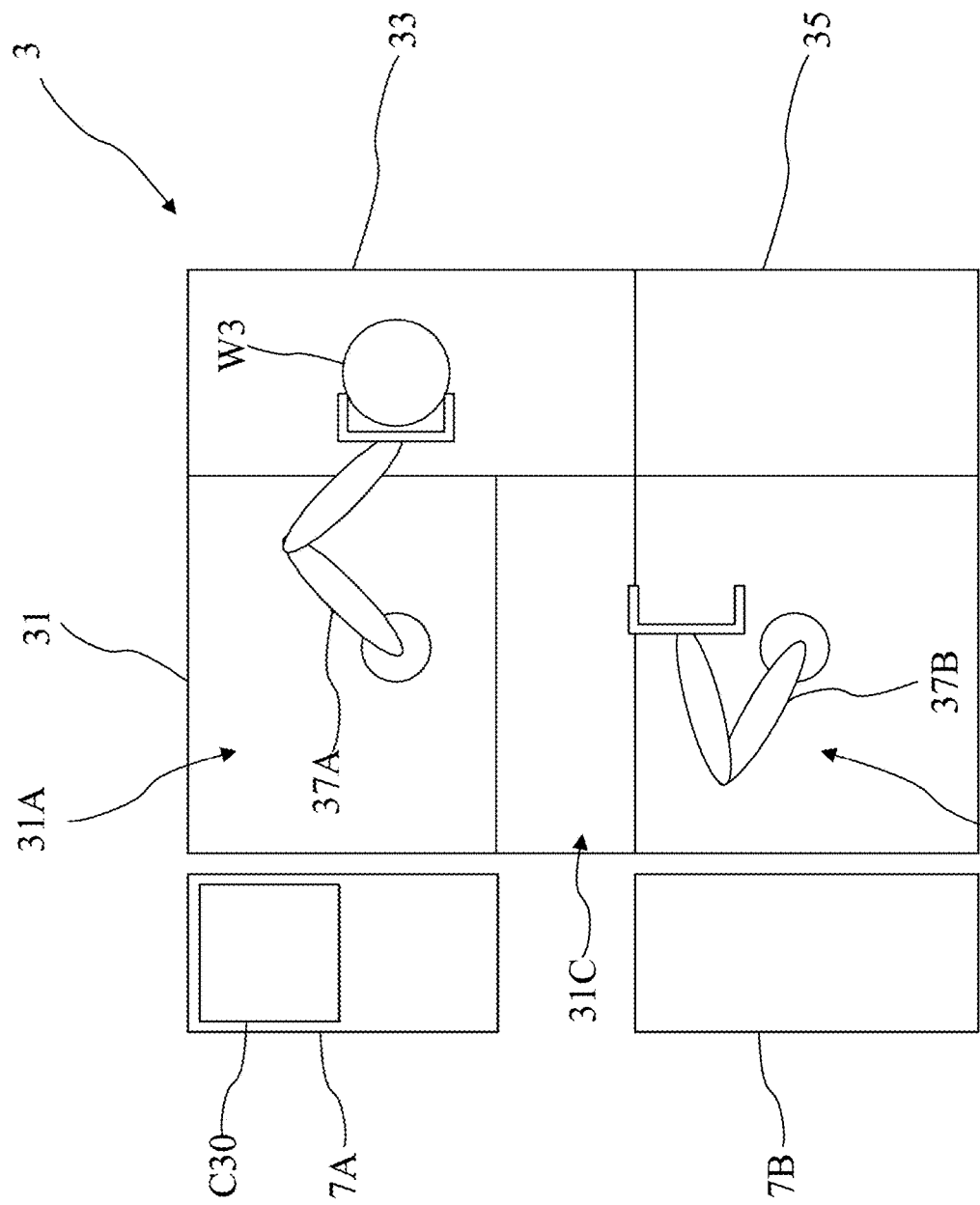
FIG. 3C is a schematic view of a wafer-measuring apparatus transferring a wafer according to some embodiments of the present disclosure.
Figure 3D:
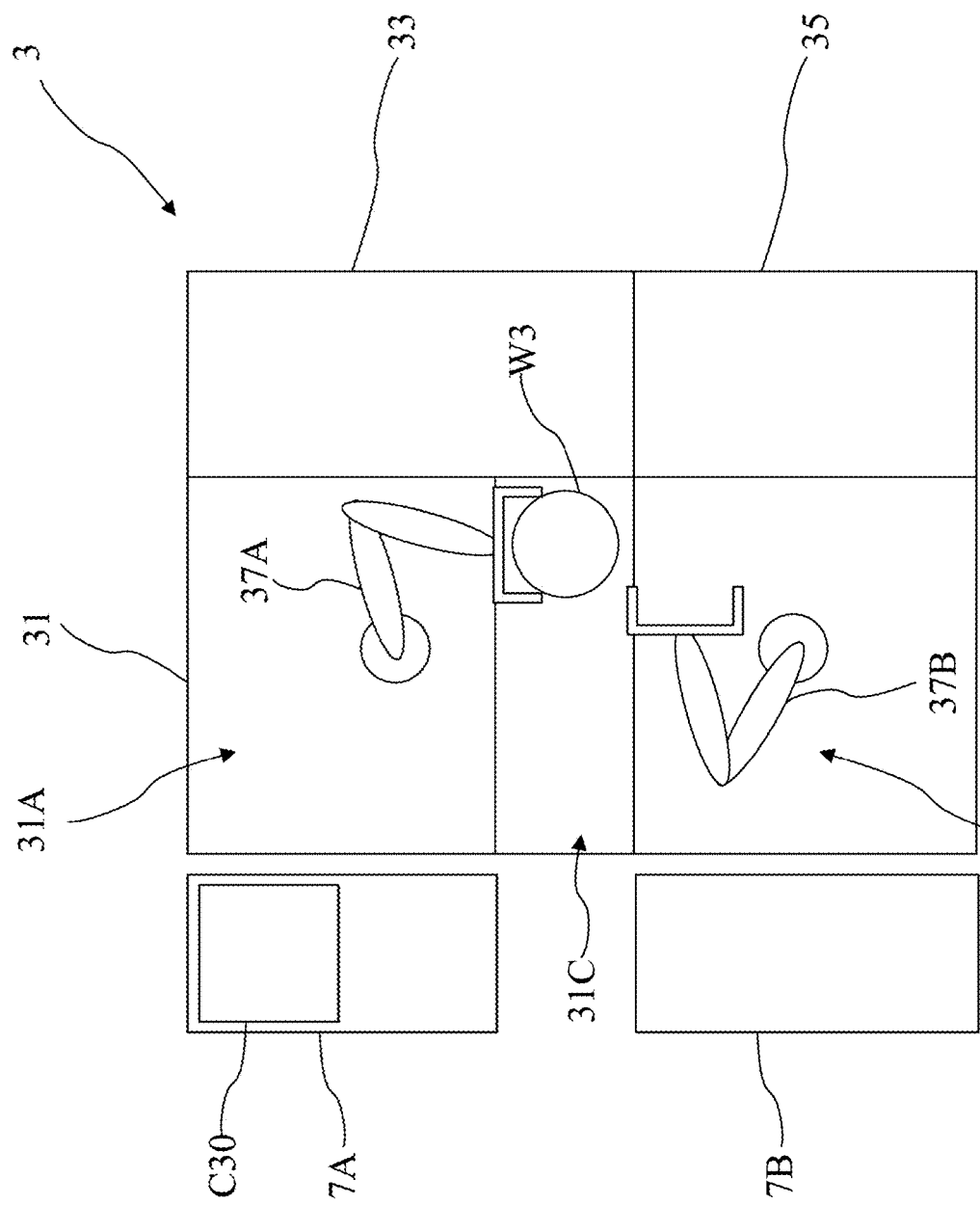
FIG. 3D is a schematic view of a wafer-measuring apparatus transferring a wafer according to some embodiments of the present disclosure.
Figure 3E:
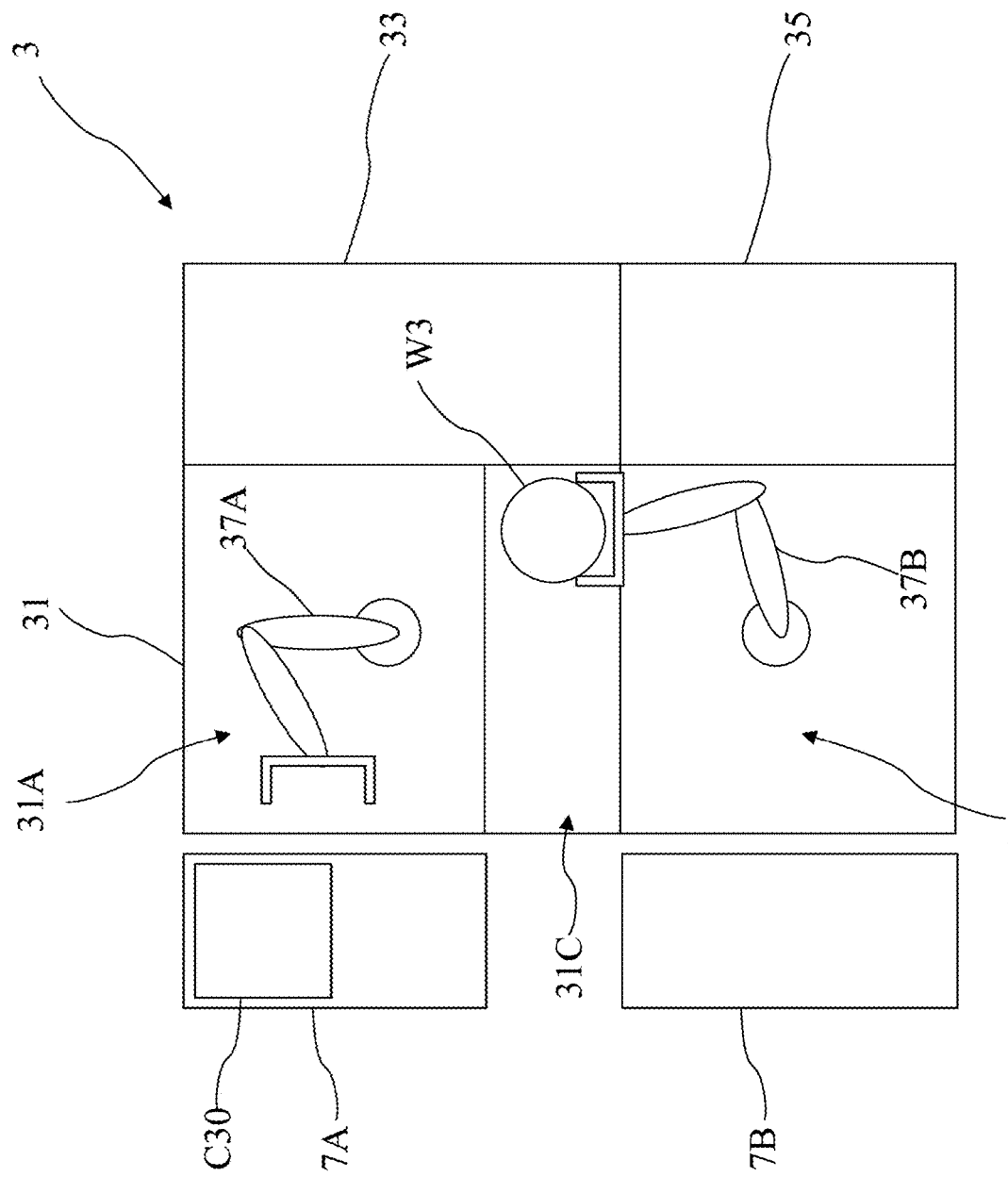
FIG. 3E is a schematic view of a wafer-measuring apparatus transferring a wafer according to some embodiments of the present disclosure.

FIG. 3A is a schematic view of a wafer-measuring apparatus 3 according to some embodiments of the present disclosure. The wafer-measuring apparatus 3 may be used for measuring wafers stored in a wafer container (e.g., a FOUP). The wafer-measuring apparatus 3 may include a body 31, a wafer-measuring unit 33, a wafer storage 35 and robots 37A and 37B.

The body 31 may include a first area 31A, a second area 31B and a buffer area 31C. The robot 37A may be disposed on the first area 31A of the body 31. The robot 37B may be disposed on the second area 31B of the body 31. The wafer container may be disposed on load port areas 7A and 7B. In some embodiments, the load port areas 7A and 7B may include load port devices respectively.

Please refer to FIGS. 3B to 3G, which are schematic views of the wafer-measuring apparatus 3 transferring wafers according to some embodiments of the present disclosure. In detail, when a wafer container. C30 loaded with wafers is disposed on the load port area 7A, the robot 37A of the wafer-measuring apparatus 3 may fetch a wafer W3 stored in the wafer container C30, and move the wafer W3 from the wafer container C30 to the wafer-measuring unit 33. After the robot 37A places the wafer W3 on the wafer-measuring unit 33, the wafer-measuring unit 33 may measure the wafer W3 for deter mining a state of the wafer W3.

In some embodiments, when the wafer W3 needs to be placed back in the wafer container C30 after the measurement, the robot 37A may move the wafer W3 from the wafer-measuring unit 33 back to the wafer container C30.

In some embodiments, when the wafer W3 needs to be placed in another wafer container after the measurement, the robot 37A may move the wafer W3 from the wafer-measuring unit 33 to the buffer area 31C of the body 31. Next, the robot 37B may move the wafer W3 from the buffer area 31C of the body 31 to the wafer storage 35.

Figure 3F:
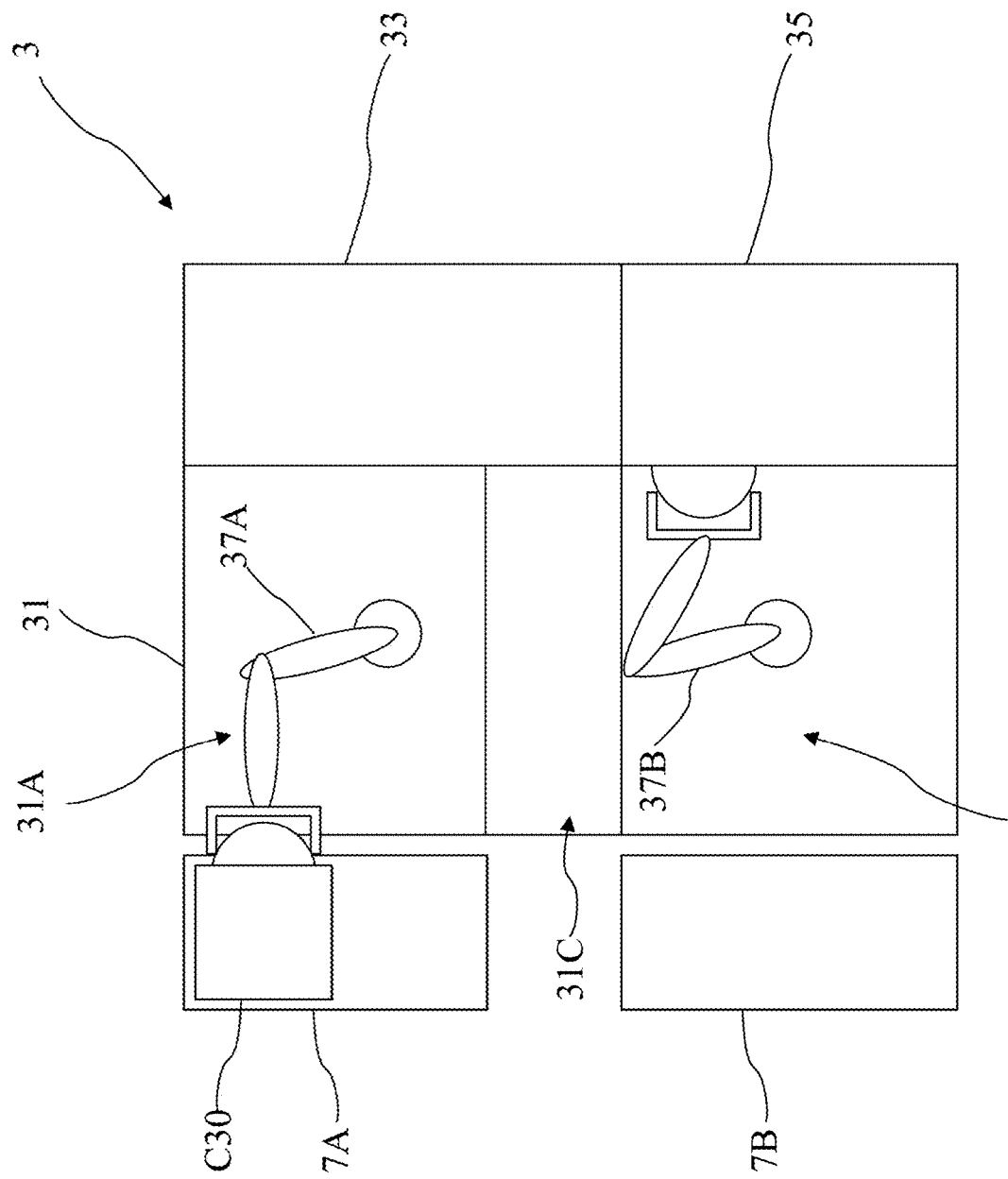
FIG. 3F is a schematic view of a wafer-measuring apparatus transferring a wafer according to some embodiments of the present disclosure.
Figure 3G:
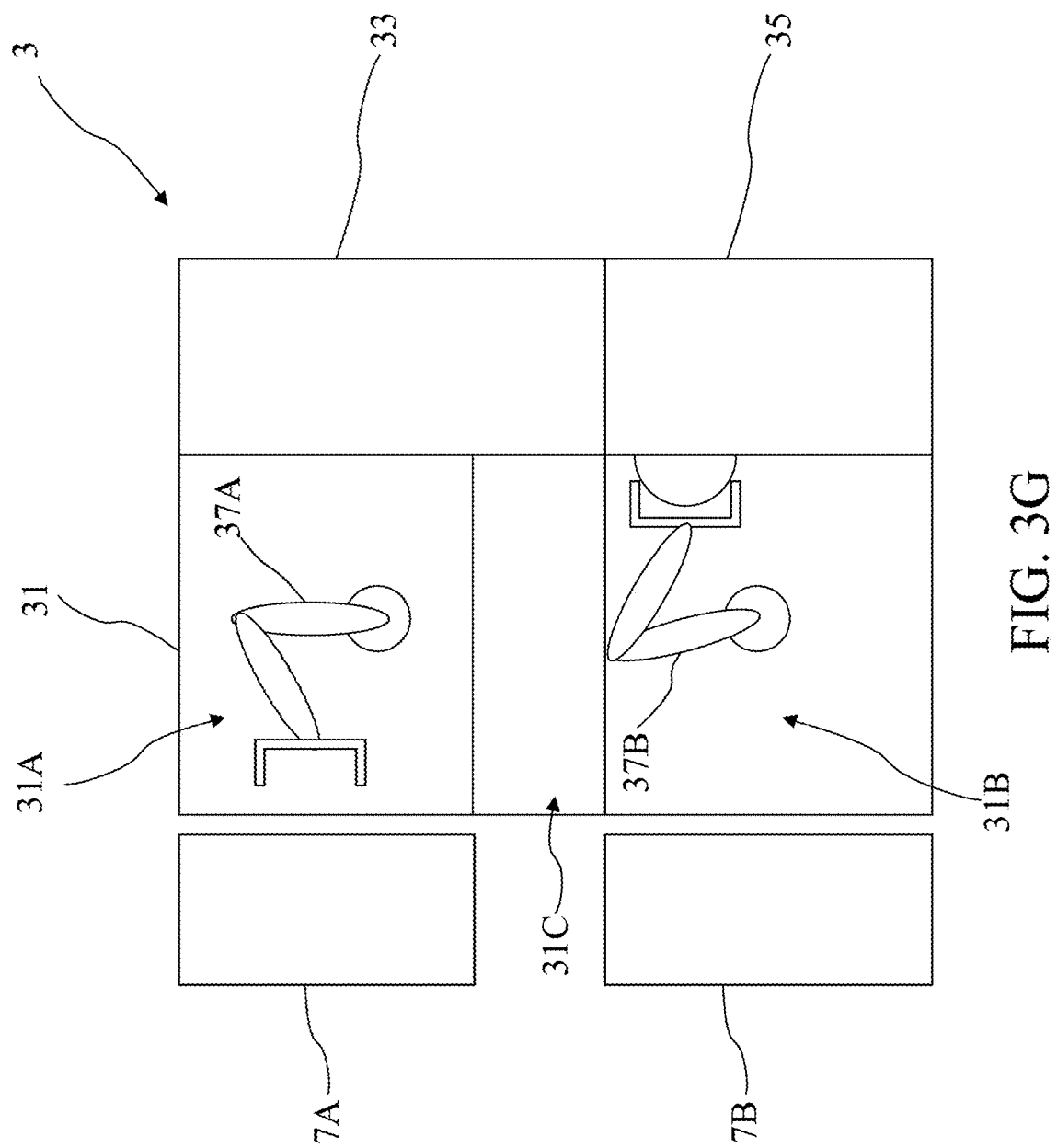
FIG. 3G is a schematic view of a wafer-measuring apparatus transferring a wafer according to some embodiments of the present disclosure.

More particularly, as shown in FIG. 3F, in some embodiments, after placing the wafer W3 on the buffer area 31C, the robot 37A may move another wafer from the wafer container C30 to the wafer-measuring unit 33 for wafer measurement. As shown in FIG. 3G, in some embodiments, the wafer container C30 may be moved away from the wafer-measuring apparatus 3 without returning the wafer W3 back to the wafer container C30.

In addition, because the wafer W3 may be stored in the wafer storage 35 until a target wafer container for storing the wafer W3 is disposed on the load port area 7B, the wafer W3 may not need to be further sorted by an additional sorter.

In some embodiments, the wafer storage 35 may be attached to the body 31 independent of the load port areas 7A and 7B. Particularly, the wafer storage 35 may be an independent wafer storage unit attached to the body 31. In other words, the wafer storage 35 may be used as a buffer storage of the wafer-measuring apparatus 3 for storing measured wafers.

Further, the buffer area 31C may be located between the first area 31A and the second area 31B. Therefore, the buffer area 31C may be used as a buffer zone for temporarily placing the measured wafers.

In some embodiments, the wafer storage 35 may include an inlet port (not shown) for connecting to a gas source (not shown). Therefore, AMC in the wafer storage 35 may be purged out by gases (e.g., clean dry air, extreme clean dry air or nitrogen) provided from the gas source.

Figure 4A:
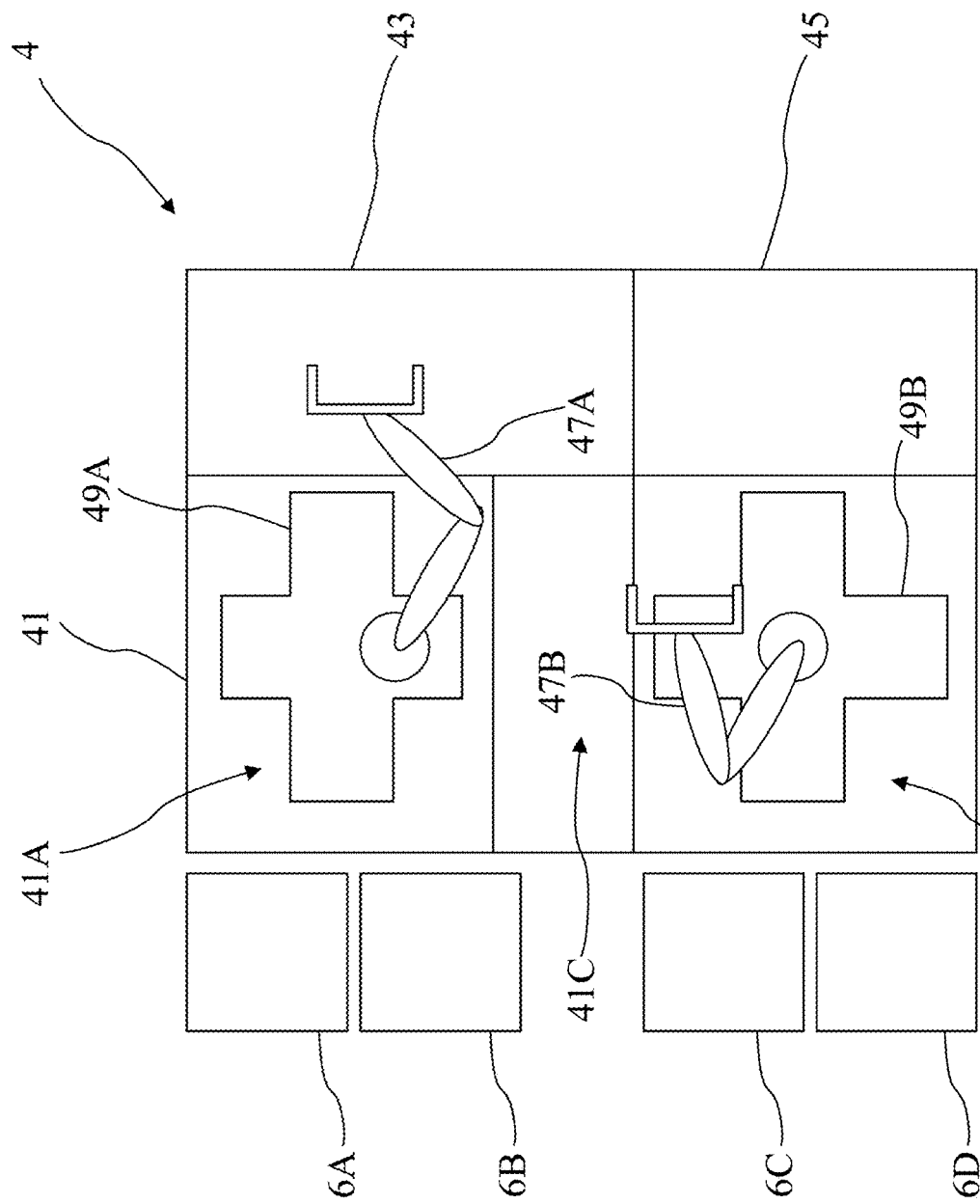
FIG. 4A is a schematic view of a wafer-measuring apparatus according to some embodiments of the present disclosure.
Figure 4B:
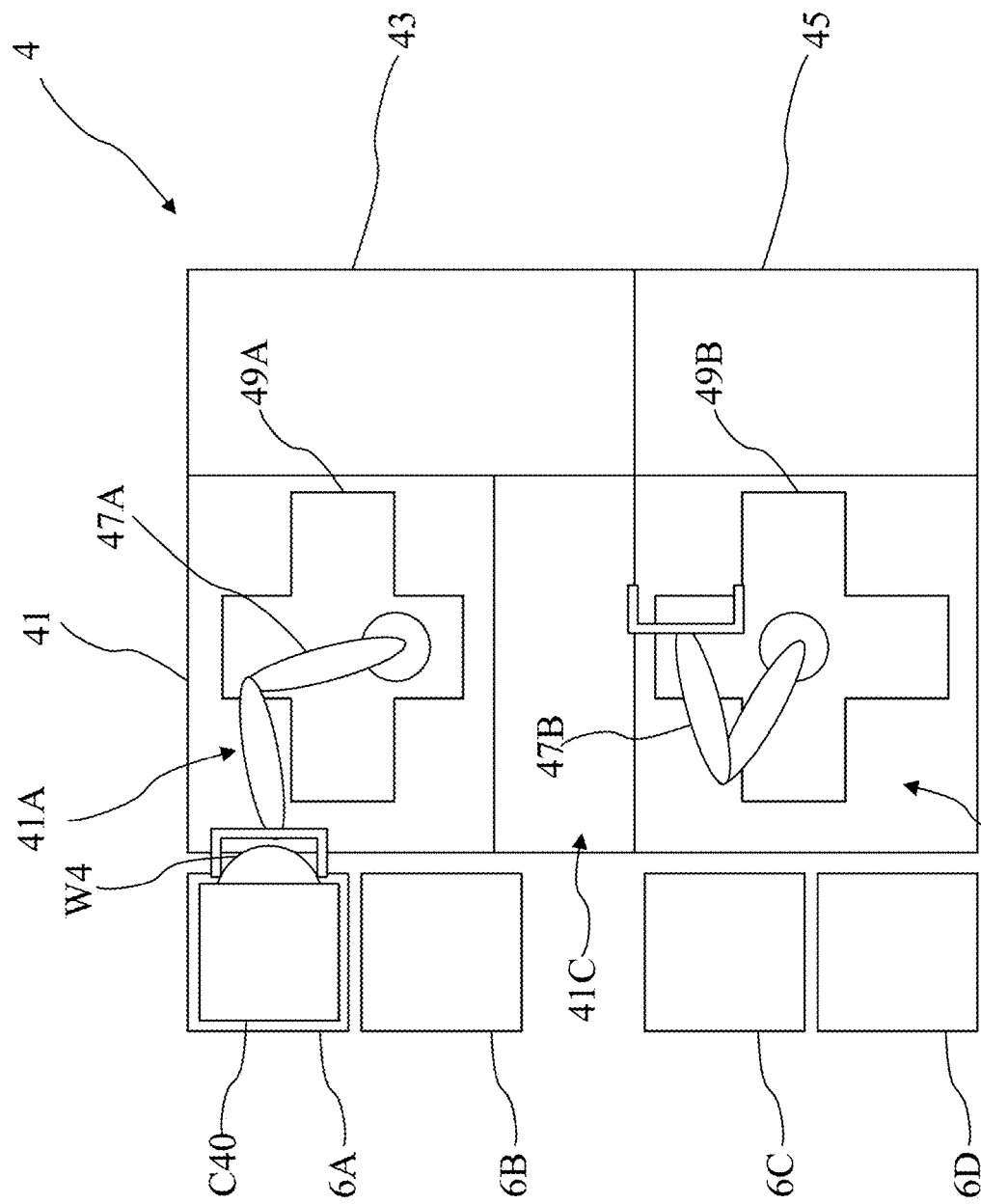
FIG. 4B is a schematic view of a wafer-measuring apparatus transferring a war according to some embodiments of the present disclosure.
Figure 4C:
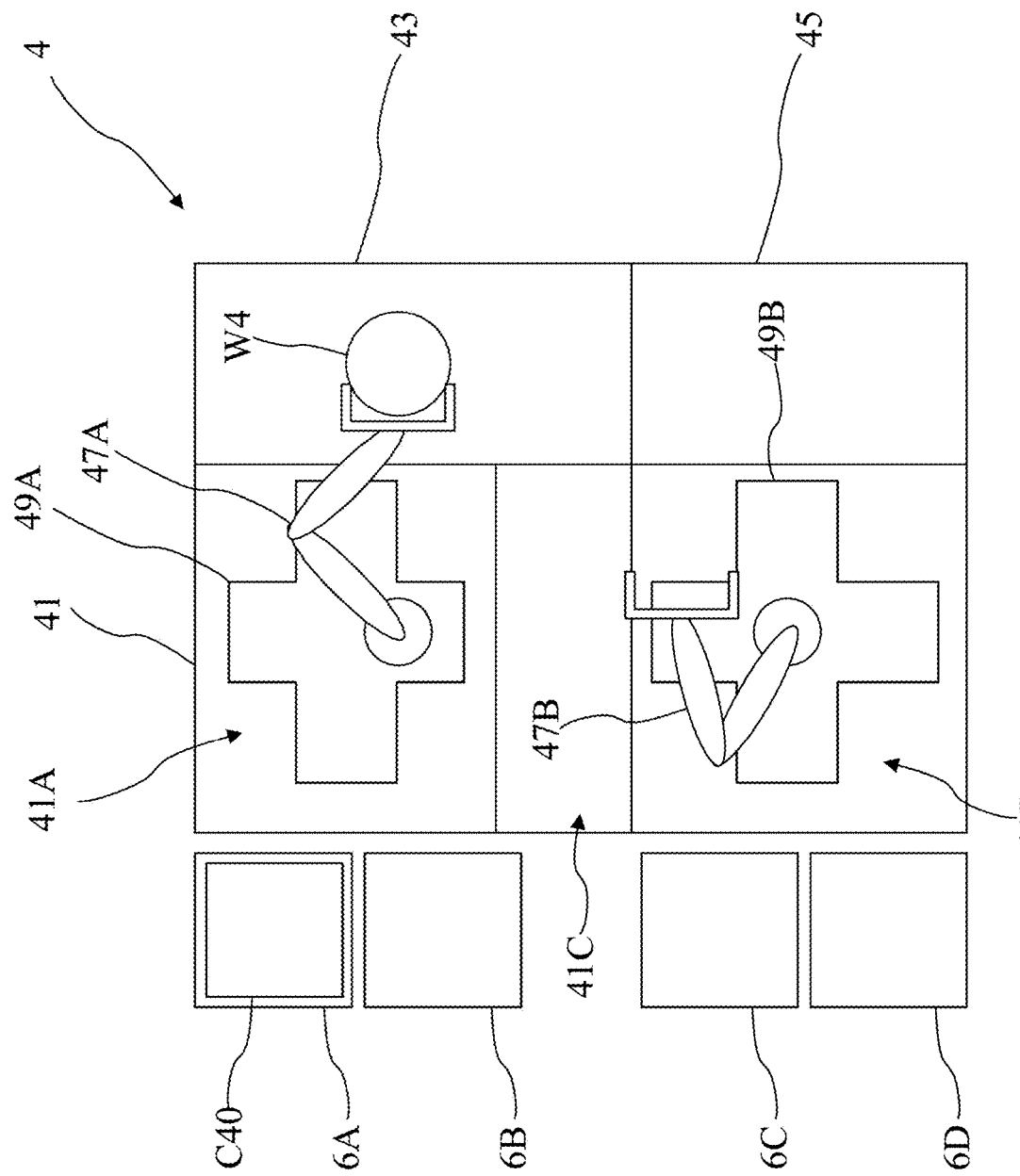
FIG. 4C is a schematic view of a wafer-measuring apparatus transferring a wafer according to some embodiments of the present disclosure.
Figure 4D:
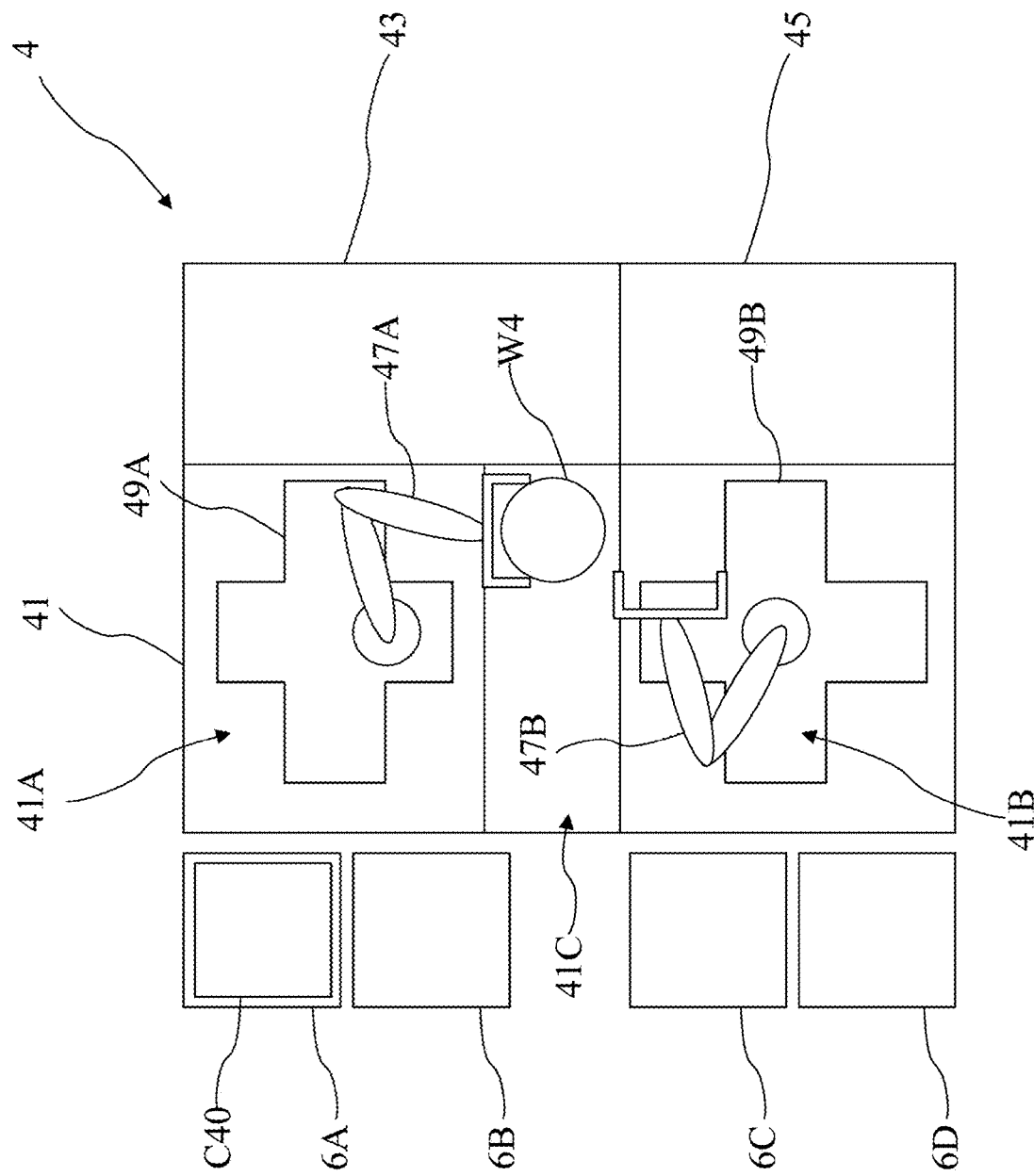
FIG. 4D is a schematic view of a wafer-measuring apparatus transferring a wafer according to some embodiments of the present disclosure.
Figure 4E:
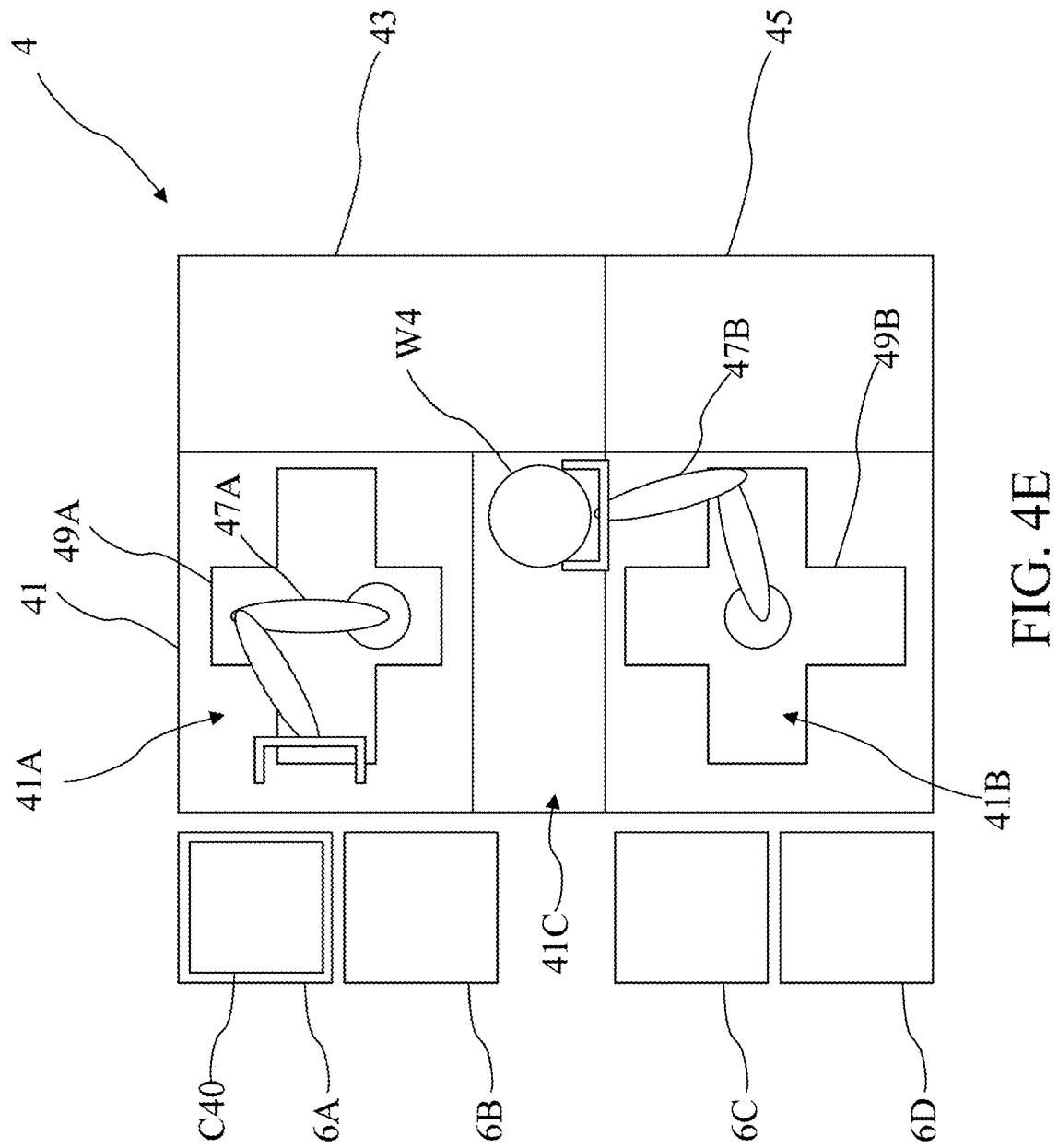
FIG. 4E is a schematic view of a wafer-measuring apparatus transferring a wafer according to some embodiments of the present disclosure.
Figure 4F:
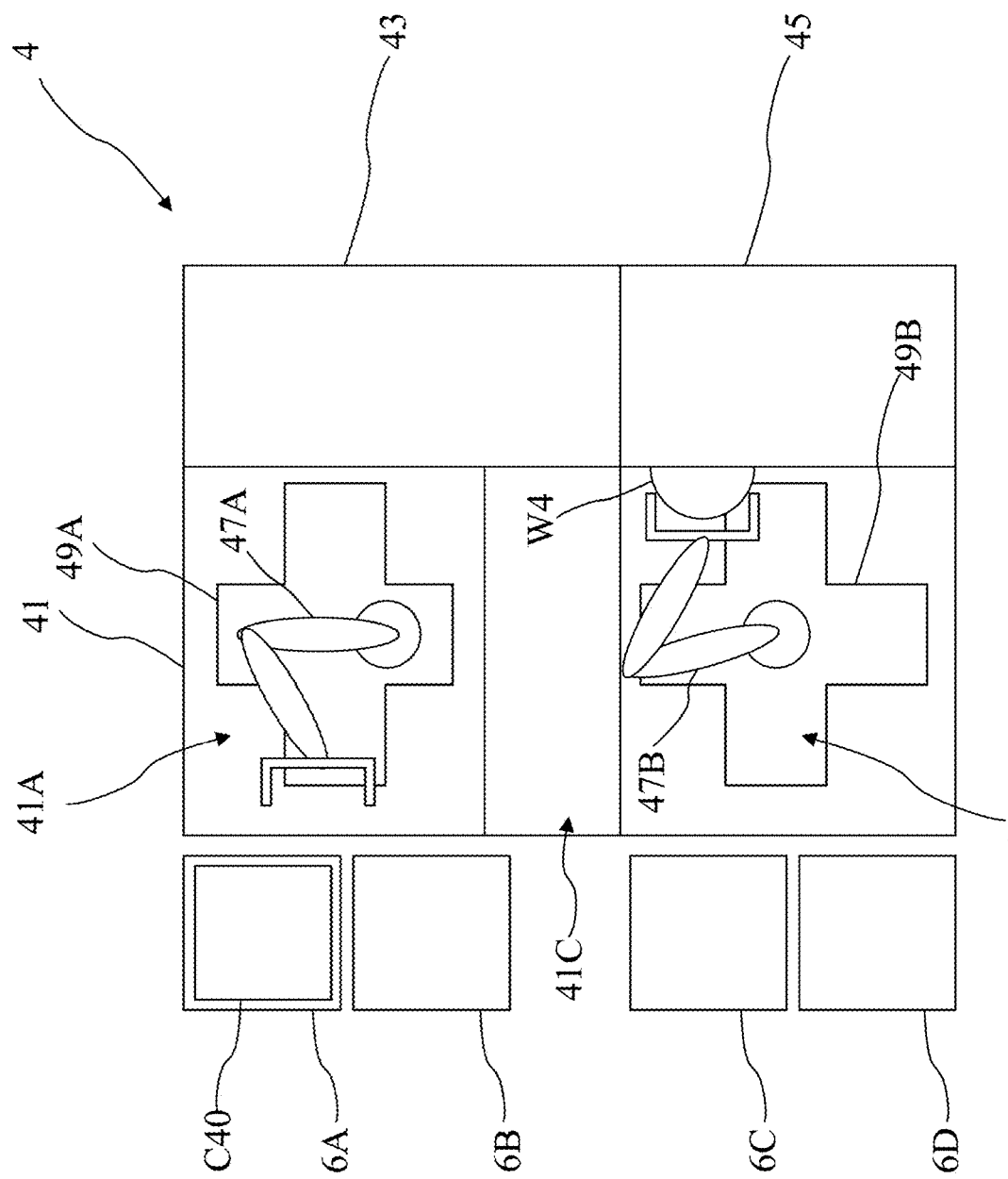
FIG. 4F is a schematic view of a wafer-measuring apparatus transferring a wafer according to some embodiments of the present disclosure.
Figure 4G:
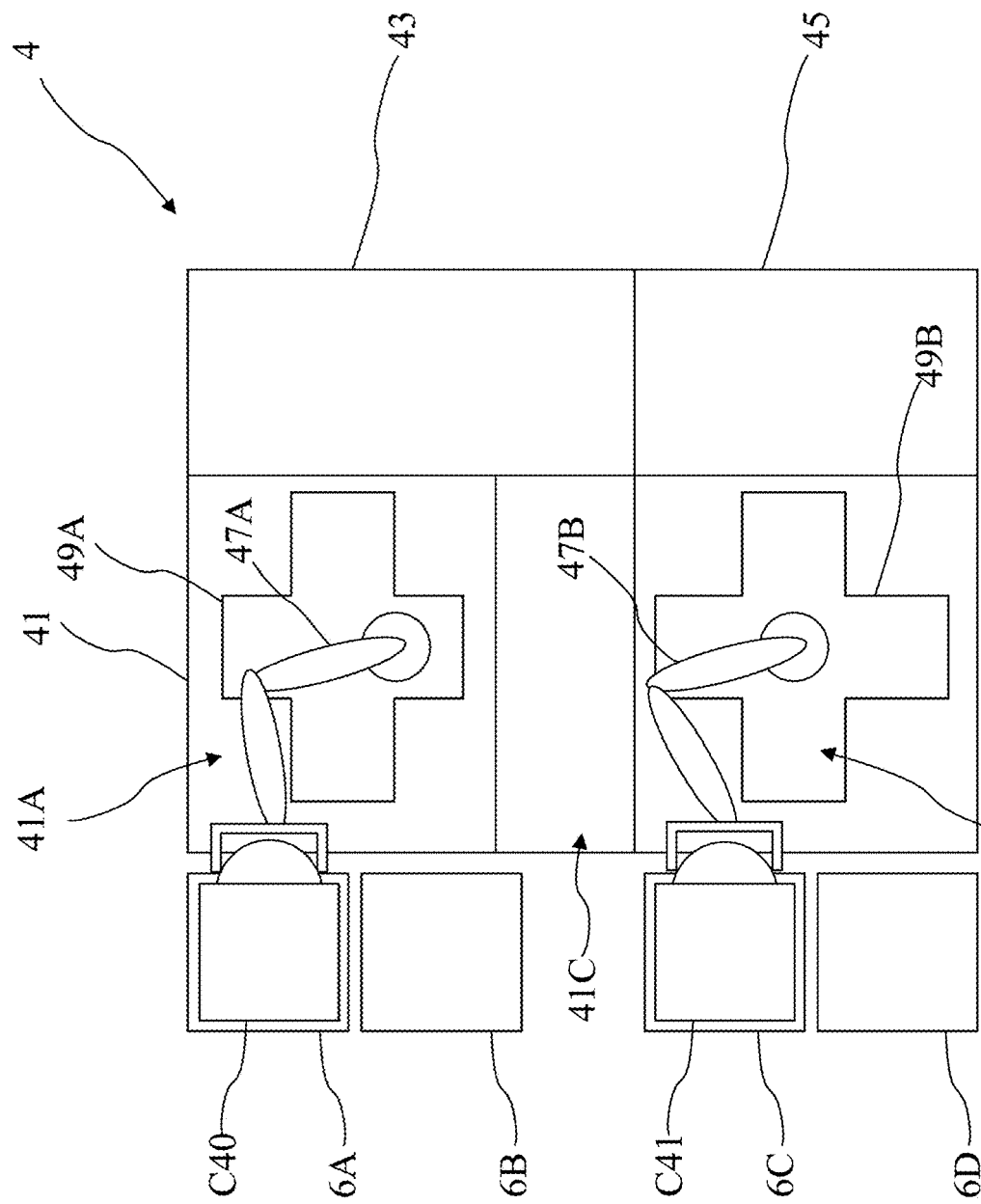
FIG. 4G is a schematic view of a wafer-measuring apparatus transferring a wafer according to some embodiments of the present disclosure.
Figure 4H:
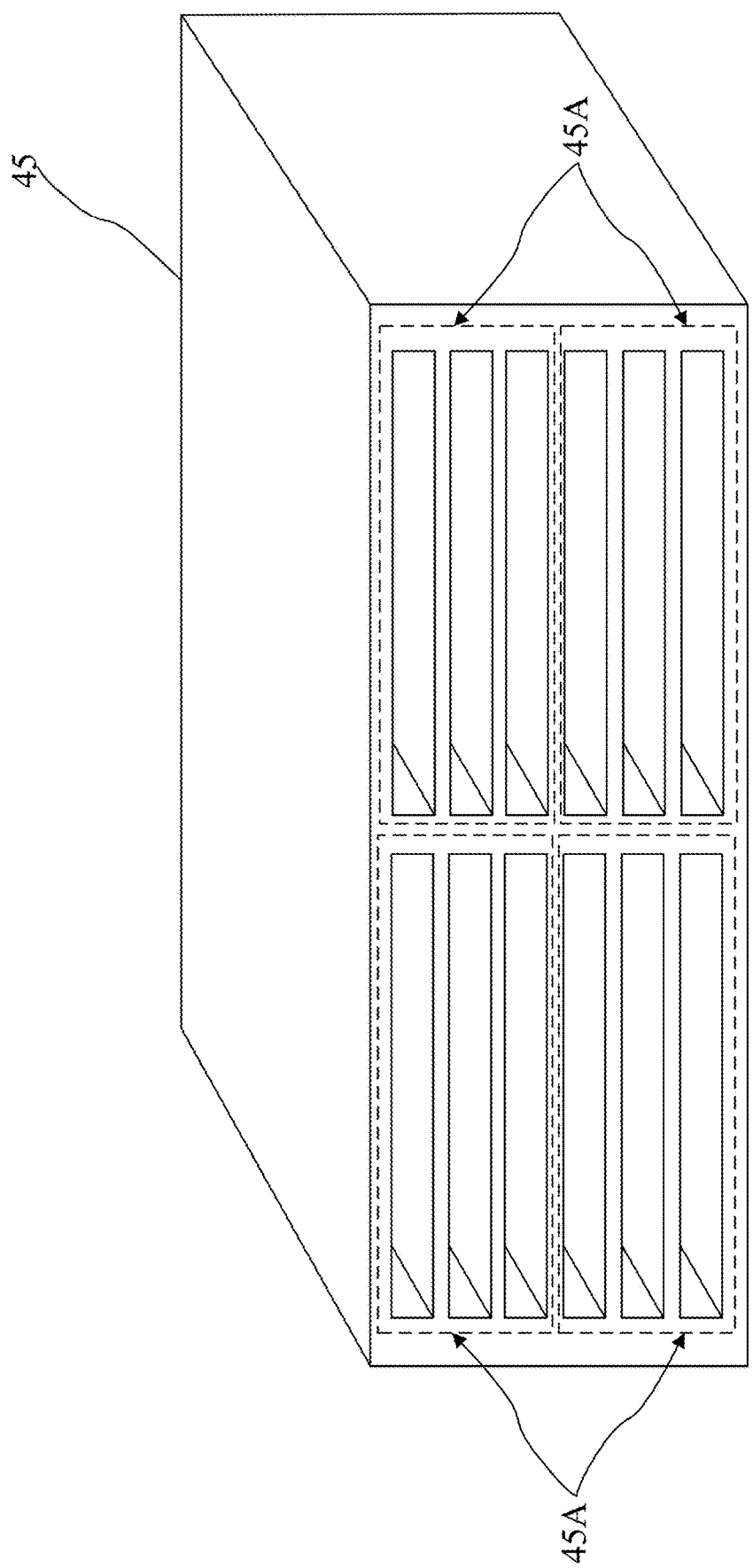
FIG. 4H is a schematic view of a wafer storage according to some embodiments of the present disclosure.

FIG. 4A is a schematic view of a wafer-measuring apparatus 4 according to some embodiments of the present disclosure. The wafer-measuring apparatus 4 may be used for measuring wafers stored in a wafer container (e.g., a FOUP). The wafer-measuring apparatus 4 may include a body 41, a wafer-measuring unit 43, a wafer storage 45, robots 47A and 47B and rails 49A and 49B.

The body 41 may include a first area 41A, a second area 41B and a buffer area 41C. The rail 49A may be formed on the first area 41A. The robot 47A may be disposed on the first area 41A of the body 41 and move along the rail 49A. The rail 49B may be formed on the second area 41B. The robot 47B may be disposed on the second area 41B of the body 41 and move along the rail 49B. The wafer container may be disposed on load port areas 6A to 6D. In some embodiments, the load port areas 6A to 6D may include load port devices respectively.

Please refer to FIGS. 4B to 4G, which are schematic views of the wafer-measuring apparatus 4 transferring wafers according to some embodiments of the present disclosure. In detail, when a wafer container. C40 loaded with wafers is disposed on the load port area 6A, the robot 47A of the wafer-measuring apparatus 4 may fetch a wafer W4 stored in the wafer container C40, and move the wafer W4 from the wafer container C40 to the wafer-measuring unit 43. After the robot 47A places the wafer W4 on the wafer-measuring unit 43, the wafer-measuring unit 43 may measure the wafer W4 for determining a state of the wafer W4.

In some embodiments, when the wafer W4 needs to be placed back in the wafer container C40 after the measurement, the robot 47A may move the wafer W4 from the wafer-measuring unit 43 back to the wafer container C40.

In some embodiments, when the wafer W4 needs to be placed in another wafer container after the measurement, the robot 47A may move the wafer W4 from the wafer-measuring unit 43 to the buffer area 41C of the body 41. Next, the robot 47B may move the wafer W4 from the buffer area 41C of the body 41 to the wafer storage 45.

More particularly, in some embodiments, after placing the wafer W4 on the buffer area 41C, the robot 47A may move another wafer from the wafer container C40 to the wafer-measuring unit 43 for wafer measurement. In some embodiments, the wafer container C40 may be moved away from the wafer-measuring apparatus 4 without returning the wafer W4 back to the wafer container C40.

Further, during the operation of the wafer-measuring apparatus 4, a wafer container C41 for storing the wafer W4 may be disposed on the load port area 6C. Accordingly, when the wafer container C41 is ready, the robot 47B may move the wafer W4 from the wafer storage 45 to the wafer container C41.

In some embodiments, the wafer storage 45 may be attached to the body 41 independent of the load port areas 6A to 6D. Particularly, the wafer storage 45 may be an independent wafer storage unit attached to the body 41. In other words, the wafer storage 45 may be used as a buffer storage of the wafer-measuring apparatus 4 for storing measured wafers.

Further, the buffer area 41C may be located between the first area 41A and the second area 41B. Therefore, the buffer area 41C may be used as a buffer zone for temporarily placing the measured wafers.

In some embodiments, the wafer storage 45 may be used for storing wafers with different states. Please refer to FIG. 4II, which is a schematic view of the wafer storage 45 according to some embodiments of the present disclosure. In detail, the wafer storage 45 may include a plurality of storage areas 45A. Each storage area 45A may correspond to one wafer state. More specifically, the storage area 45A corresponding to a specific wafer state may be used for storing the wafer measured as the specific wafer state.

For example, each storage area 45A can store 6 wafers. When a wafer is measured and classified as state "X" by the wafer-measuring unit 43, the robot 47A moves the wafer from the wafer-measuring unit 43 to the buffer area 41C of the body 41, and then the robot 47B moves the wafer from the buffer area 41C of the body to the storage area 45A, which is used for storing wafers with state "X," of the wafer storage 45. Further, when a specific wafer container used for storing wafers with state "X" is disposed on the load port area 6C or 6D, the robot 47B moves the wafer from the storage areas 45A for storing wafers with state "X" to the specific wafer container.

Similarly, when a wafer is measured and classified as state "Y" by the wafer-measuring unit 43, the robot 47A moves the wafer from the wafer-measuring unit 43 to the buffer area 41C of the body 41, and then the robot 47B moves the wafer from the buffer area 41C of the body to the storage area 45A, which is used for storing wafers with state "Y," of the wafer storage 45. Further, when a specific wafer container used for storing wafers with state "Y" is disposed on the load port area 6C or 6D, the robot 47B moves the wafer from the storage area 45A for storing wafers with state "Y" to the specific wafer container.

In some embodiments, the wafer storage 45 may include an inlet port (not shown) for connecting to a gas source (not shown). Therefore, AMC in the wafer storage 45 may be purged out by gases (e.g., clean dry air, extreme clean dry air or nitrogen) provided from the gas source.

Figure 5:
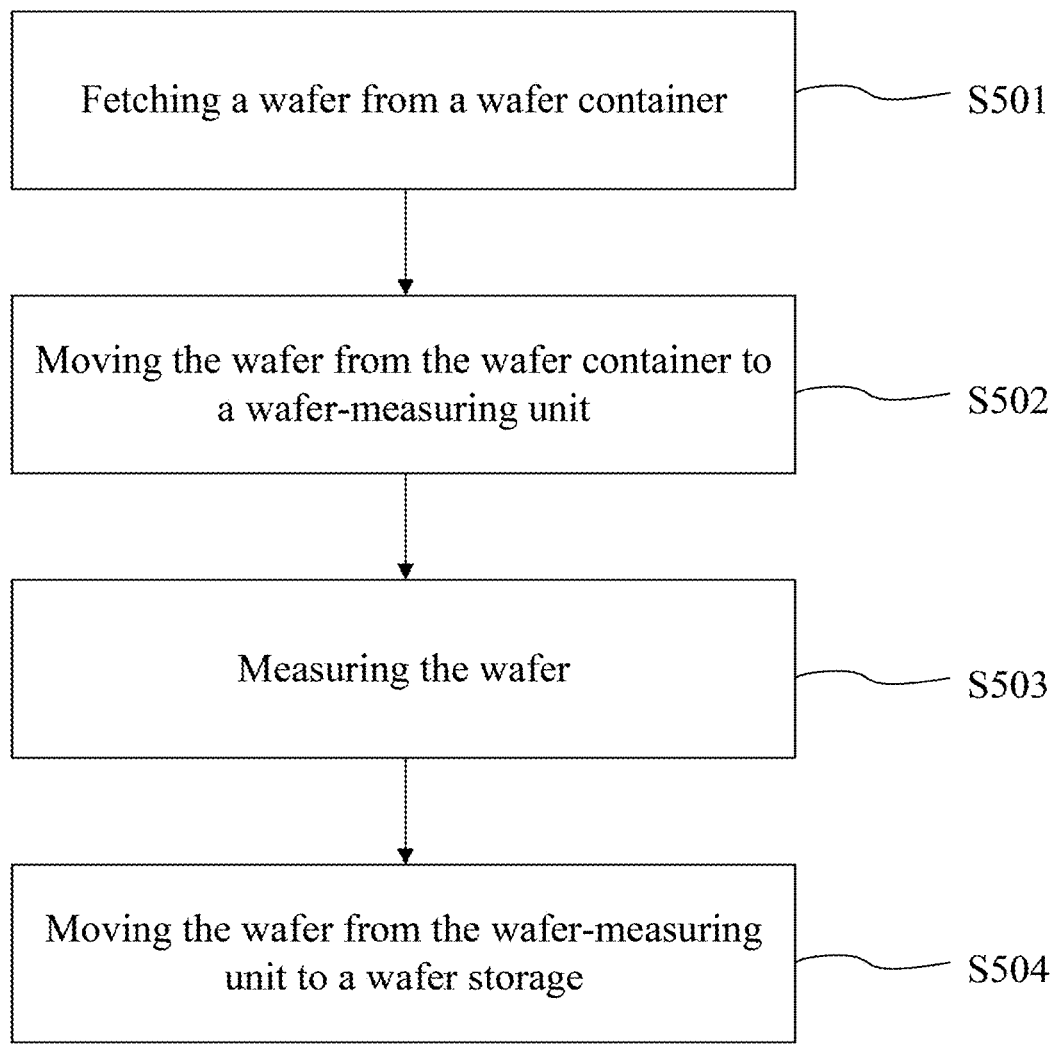
FIG. 5 is a flowchart diagram of a wafer-transferring method according to some embodiments of the present disclosure.

FIG. 5 is a flowchart diagram of a wafer-transferring method according to some embodiments of the present disclosure. The wafer-transferring method according to some embodiments is for use in a wafer-measuring apparatus (e.g., the wafer-measuring apparatus of the aforesaid embodiments). The wafer-measuring apparatus may be used for measuring wafers stored in a wafer container (e.g., a FOUP). The wafer container may be disposed on a load port area. Detailed steps of the wafer-transferring method are described below.

Operation S501 is executed to fetch, by a robot of the wafer-measuring apparatus, a wafer from the wafer container. Operation S502 is executed to move, by the robot, the wafer from the wafer container to a wafer-measuring unit of the wafer-measuring apparatus. Operation S503 is executed to measure, by the wafer-measuring unit, the wafer. After the wafer is measured, operation S504 is executed to move, by the robot, the wafer from the wafer-measuring unit to a wafer storage of the wafer-measuring apparatus.

In some embodiments, after the robot fetches the wafer from the wafer container, the wafer container may be moved away from the load port area when the wafer container is no longer necessary. Meanwhile, a target wafer container for storing the measured wafer may be moved to the load port area. Therefore, the wafer-transferring method may further include an operation of moving, by the robot, the wafer from the wafer storage to the target wafer container when the target wafer container is ready.

In some embodiments, the wafer storage may be independent of the load port area. Particularly, the wafer storage may be an independent wafer storage unit of the wafer-measuring apparatus. In other words, the wafer storage may be used as a buffer storage of the wafer-measuring apparatus for storing measured wafers. Therefore, the wafer may be temporarily stored in the independent wafer storage of the wafer-measuring apparatus for later operations.

It should be noted that the position in which the wafer storage is attached to the wafer-measuring apparatus may be adjusted when necessary. The above-mentioned embodiments are not intended to limit the position in which the wafer storage is attached to the wafer-measuring apparatus of the present disclosure.

Figure 6:
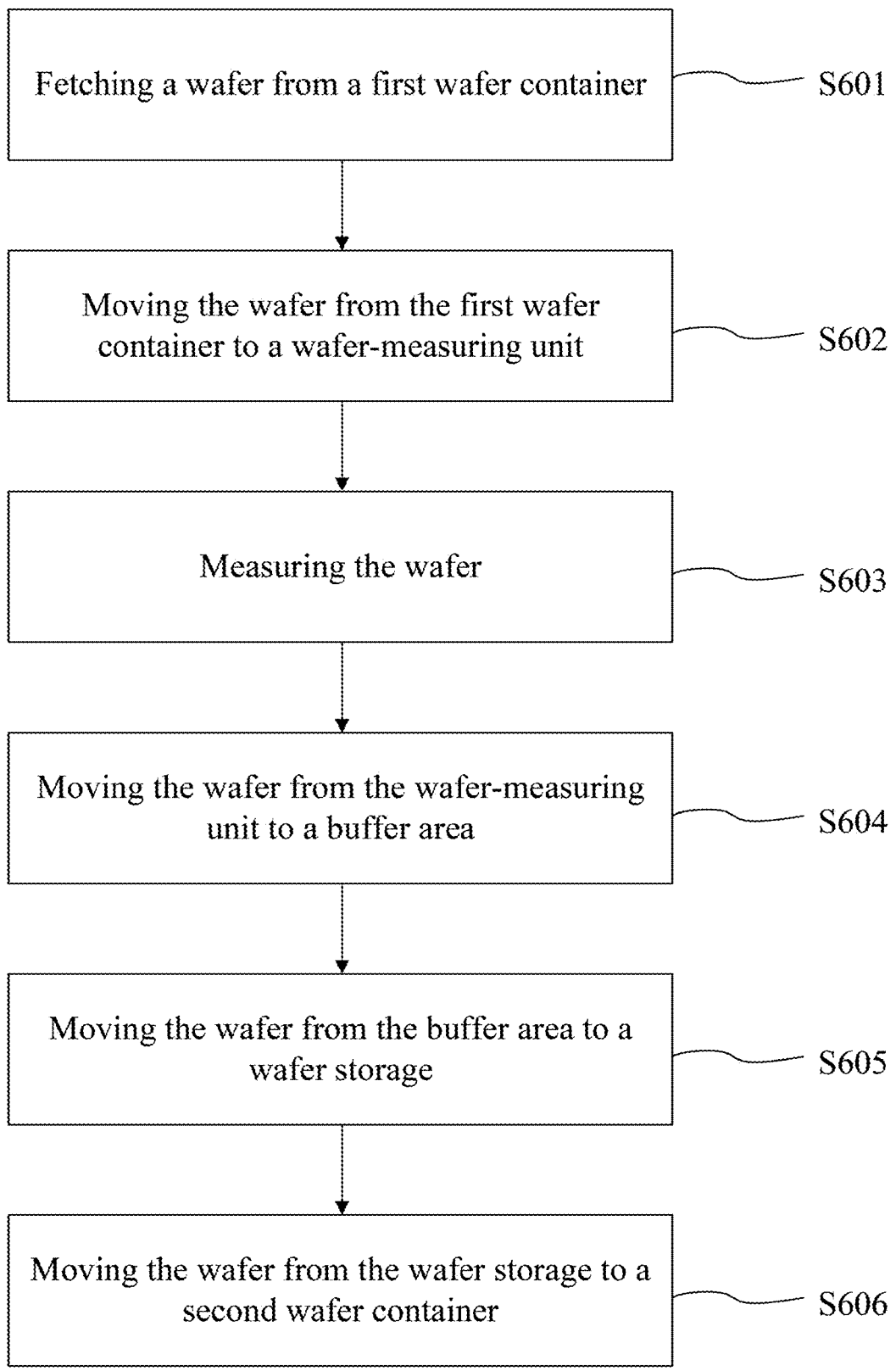
FIG. 6 is a flowchart diagram of a wafer-transferring method according to some embodiments of the present disclosure.

FIG. 6 is a flowchart diagram of a wafer-transferring method according to some embodiments of the present disclosure. The wafer-transferring method according to some embodiments is for use in a wafer-measuring apparatus (e.g., the wafer-measuring apparatus of the aforesaid embodiments). The wafer-measuring apparatus may be used for measuring wafers stored in a wafer container (e.g., a FOUP). The wafer container may be disposed on a first load port area. Detailed steps of the wafer-transferring method are described below.

Operation S601 is executed to fetch, by a first robot of the wafer-measuring apparatus, a wafer from the wafer container. Operation S602 is executed to move, by the first robot, the wafer from the wafer container to a wafer-measuring unit of the wafer-measuring apparatus. Operation S603 is executed to measure, by the wafer-measuring unit, the wafer.

Next, operation S604 is executed to move, by the first robot, the wafer from the wafer-measuring unit to a buffer area of the wafer-measuring apparatus. Operation S605 is executed to move, by a second robot of the wafer-measuring apparatus, the wafer from the buffer area to a wafer storage of the wafer-measuring apparatus.

In some embodiments, when a second wafer container for storing the measured wafer is moved to a second load port area, operation S606 is executed to move, by the second robot, the wafer from the wafer storage to the second wafer container.

It shall be particularly appreciated that the robots and the wafer-measuring units mentioned in the above embodiments may be controlled by a manufacturing execution system (MES) (not shown). Further, the operations of the movements of the robots and the measurements of the wafer-measuring units may also be scheduled by the MES.

The MES may include a central processing unit (CPU), other hardware circuit elements capable of executing relevant instructions, or a combination of computing circuits that are well-known by those skilled in the art based on the above disclosures.

In some embodiments, the MES may be included in an external device, which may communicate with the wafer-measuring apparatus by communication buses. In some embodiments, the MES may be embedded in the wafer-measuring apparatus and communicate with the electronic elements by communication buses.

In addition, communication buses may be used for transferring data between the electronic elements, such as the MES device, the robots and the wafer-measuring units, and may include an electrical bus interface, an optical bus interface or a wireless bus interface. However, such description is not intended to limit the hardware implementation embodiments of the present disclosure.

One aspect of the present disclosure provides a wafer-measuring apparatus, including a body, a wafer-measuring unit, a wafer storage and a robot. The robot is disposed on the body and configured to: move a wafer from a first wafer container to the wafer-measuring unit, wherein the first wafer container is disposed on a load port area; and move the wafer from the wafer-measuring unit to the wafer storage after the wafer-measuring unit measures the wafer.

Another aspect of the present disclosure provides a wafer-measuring apparatus, including a body, a wafer-measuring unit, a wafer storage, a first robot and a second robot. The body includes a first area, a second area and a buffer area. The first robot is disposed on the first area of the body and configured to: move a wafer from a first wafer container to the wafer-measuring unit, wherein the first wafer container is disposed on a first load port area; and move the wafer from the wafer-measuring unit to the buffer area of the body after the wafer-measuring unit measures the wafer. The second robot is disposed on the second area of the body and configured to: move the wafer from the buffer area of the body to the wafer storage.

Another aspect of the present disclosure provides a wafer-transferring method of a wafer-measuring apparatus. The wafer-transferring method includes: moving, by a robot set of the wafer-measuring apparatus, a wafer from a first wafer container to a wafer-measuring unit of the wafer-measuring apparatus, wherein the first wafer container is disposed on a first load port area; measuring, by the wafer-measuring unit, the wafer; and moving, by the robot set, the wafer from the wafer-measuring unit to a wafer storage of the wafer-measuring apparatus after the wafer is measured.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A wafer-measuring apparatus, comprising:
    a body including:
        a first area;
        a second area; and
        a buffer area;
    a wafer-measuring unit;
    a wafer storage;
    a first robot, being disposed on the first area of the body and configured to:
        move a wafer from a first wafer container to the wafer-measuring unit, wherein the first wafer container is disposed on a first load port area; and
        move the wafer from the wafer-measuring unit to the buffer area of the body after the wafer-measuring unit measures the wafer; and
    a second robot, being disposed on the second area of the body and configured to:
        move the wafer from the buffer area of the body to the wafer storage;
    wherein the second robot is further configured to:
        move the wafer from the wafer storage to a second wafer container, wherein the second wafer container is disposed on a second load port area;
    wherein the wafer storage is attached to the body independent of the first load port area and the second load port area.

2. The wafer-measuring apparatus of claim 1, wherein the wafer storage further comprises:
    a plurality of storage areas;
    wherein moving the wafer from the wafer-measuring unit to the buffer area of the body further comprises:
        moving the wafer from the wafer-measuring unit to the buffer area of the body after the wafer-measuring unit measures and classifies the wafer; and
    wherein moving the wafer from the buffer area of the body to the wafer storage further comprises:
        moving the wafer from the buffer area of the body to one storage area of the wafer storage.

3. The wafer-measuring apparatus of claim 2, wherein each storage area corresponds to one wafer state.

4. The wafer-measuring apparatus of claim 1, further comprising:
    a first rail formed on the first area of the body, wherein the first robot moves along the first rail.

5. The wafer-measuring apparatus of claim 4, further comprising:
    a second rail formed on the second area of the body, wherein the second robot moves along the second rail.

6. The wafer-measuring apparatus of claim 1, wherein the wafer storage further comprises an inlet port for connecting to a gas source.

7. The wafer-measuring apparatus of claim 1, wherein the buffer area is located between the first area and the second area.

8. A wafer-transferring method of a wafer-measuring apparatus, comprising:
    moving, by a robot set of the wafer-measuring apparatus, a wafer from a first wafer container to a wafer-measuring unit of the wafer-measuring apparatus, wherein the first wafer container is disposed on a first load port area;
    measuring, by the wafer-measuring unit, the wafer; and
    moving, by the robot set, the wafer from the wafer-measuring unit to a wafer storage of the wafer-measuring apparatus after the wafer is measured;
    wherein the robot set further comprises a first robot and a second robot, and moving the wafer from the first wafer container to the wafer-measuring unit further comprises:
        moving, by the first robot, the wafer from the first wafer container to the wafer-measuring unit of the wafer-measuring apparatus;
    wherein moving the wafer from the wafer-measuring unit to the wafer storage further comprises:

moving, by the first robot, the wafer from the wafer-measuring unit to a buffer area of the wafer-measuring apparatus after the wafer-measuring unit measures the wafer; and moving, by the second robot, the wafer from the buffer area of the wafer-measuring apparatus to the wafer storage of the wafer-measuring apparatus.

9. The wafer-transferring method of claim 8, wherein the wafer storage of the wafer-measuring apparatus is independent of the first load port area.

10. The wafer-transferring method of claim 8, further comprising:

moving, by the second robot, the wafer from the wafer storage to a second wafer container, wherein the second wafer container is disposed on a second load port area.

* * * * *